US012813124B2

(12) United States Patent
Kim et al.

(10) Patent No.: US 12,813,124 B2
(45) Date of Patent: Nov. 24, 2026

(54) OPTICAL MEMBER INCLUDING LIGHT CONTROL LAYER AND DISPLAY PANEL INCLUDING THE SAME

(71) Applicant: Samsung Display Co., Ltd., Yongin-si (KR)

(72) Inventors: Inok Kim, Osan-si (KR); Chansu Kim, Asan-si (KR); Keunchan Oh, Hwaseong-si (KR); Gak Seok Lee, Hwaseong-si (KR); Sanghun Lee, Hwaseong-si (KR); Soyun Lee, Seoul (KR); Jieun Jang, Suwon-si (KR); Chang-Soon Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 579 days.

(21) Appl. No.: 17/957,504

(22) Filed: Sep. 30, 2022

(65) Prior Publication Data

US 2023/0209960 A1 Jun. 29, 2023

(30) Foreign Application Priority Data

Dec. 24, 2021 (KR) ........................ 10-2021-0186884

(51) Int. Cl.
*H10K 59/38* (2023.01)
*H10K 59/80* (2023.01)

(52) U.S. Cl.
CPC ......... *H10K 59/38* (2023.02); *H10K 59/8791* (2023.02); *H10K 59/8792* (2023.02)

(58) Field of Classification Search
CPC ...... H10K 59/38; H10K 50/86; H10K 50/865; H10K 50/13; H10K 59/12; H10K 59/32;
(Continued)

(56) References Cited

U.S. PATENT DOCUMENTS 4,652,911 A * 3/1987 Teranishi ............. H04N 25/133 348/E9.01
6,654,082 B1 * 11/2003 Sohda ............... G02F 1/133514 349/110

(Continued)

FOREIGN PATENT DOCUMENTS

JP 2007269970 A 10/2007
JP 2008286827 A * 11/2008 ............. G02F 1/335

(Continued)

OTHER PUBLICATIONS

European Search Report mailed Oct. 27, 2025 in EP Application No. 22911806.2, 10 pages.

(Continued)

*Primary Examiner* — Duy T Nguyen
(74) *Attorney, Agent, or Firm* — CANTOR COLBURN LLP

(57) ABSTRACT

A display panel includes a light-emitting element which outputs source light and includes a first electrode, a light-emitting layer disposed on the first electrode, and a second electrode disposed on the light-emitting layer, a light control layer disposed on the light-emitting element and including a first light control pattern which converts the source light into first light, and a second light control pattern which transmits the source light, and a color filter layer disposed on the light control layer and including a first color filter overlapping the first light control pattern, and a second color filter overlapping the second light control pattern. The first color filter has a light transmittance of 70% or less in a wavelength range of 600 nm to 640 nm, and the second color filter has a light transmittance of 75% or less in a wavelength range of 430 nm to 470 nm.

18 Claims, 7 Drawing Sheets

(58) Field of Classification Search
CPC ......... H10K 59/8792; H10K 2102/331; H10K 50/844; H10K 50/858; G02B 5/20; G02F 1/01; G02F 1/133514; G09F 9/30; H10H 29/142
USPC ........................................................... 257/40
See application file for complete search history.

(56) References Cited

U.S. PATENT DOCUMENTS

| | | | | |
|---|---|---|---|---|
| 10,539,826 | B2 | 1/2020 | Lee et al. | |
| 10,686,019 | B2 | 6/2020 | Lee et al. | |
| 10,872,931 | B2 | 12/2020 | Kim et al. | |
| 11,380,874 | B2 | 7/2022 | Lee | |
| 2004/0251814 | A1 | 12/2004 | Nishikawa et al. | |
| 2005/0116619 | A1* | 6/2005 | Kuma | H10K 59/38 313/503 |
| 2005/0253505 | A1* | 11/2005 | Braak | H10K 59/8792 313/506 |
| 2008/0029710 | A1* | 2/2008 | Sekiya | C09K 11/70 252/301.4 R |
| 2016/0041317 | A1* | 2/2016 | Kim | G02B 5/201 359/891 |
| 2017/0139269 | A1* | 5/2017 | Asakawa | G02F 1/133514 |
| 2018/0374409 | A1 | 12/2018 | Lee et al. | |
| 2019/0140148 | A1* | 5/2019 | Yoshimura | C09K 11/0883 |
| 2019/0198788 | A1* | 6/2019 | Park | H10K 50/19 |
| 2020/0006437 | A1* | 1/2020 | Kim | H10K 59/38 |
| 2020/0249382 | A1* | 8/2020 | Lin | G02B 5/201 |
| 2021/0341649 | A1 | 11/2021 | Lim et al. | |

FOREIGN PATENT DOCUMENTS

| | | | |
|---|---|---|---|
| JP | 2010026268 | A | 2/2010 |
| JP | 6670804 | B2 | 3/2020 |
| JP | WO2020241328 | A1 | 9/2021 |
| KR | 1020040067985 | A | 7/2004 |
| KR | 1020040093143 | A | 11/2004 |
| KR | 1020090051161 | A | 5/2009 |
| KR | 1020190058130 | A | 5/2019 |
| KR | 1020190110660 | A | 10/2019 |
| KR | 1020210028804 | A | 3/2021 |
| KR | 1020210134206 | A | 11/2021 |

OTHER PUBLICATIONS

European Office Action for EP Patent Application No. 22 911 806.2; dated Oct. 2, 2026; 10 pages.

* cited by examiner

OPTICAL MEMBER INCLUDING LIGHT CONTROL LAYER AND DISPLAY PANEL INCLUDING THE SAME

This application claims priority to Korean Patent Application No. 10-2021-0186884, filed on Dec. 24, 2021, and all the benefits accruing therefrom under 35 U.S.C. § 119, the content of which in its entirety is herein incorporated by reference.

BACKGROUND

1. Field

The disclosure herein relates to an optical member and a display panel, and more particularly, to an optical member and a display panel having reduced reflectance and improved color reproducibility.

2. Description of the Related Art

A display panel includes a transmissive display panel that selectively transmits source light generated from a light source, and an emissive display panel that generates source light from a display panel itself. The display panel may include different types of light control patterns based on arrangement of pixels to generate a color image. The light control patterns may transmit only source light having a predetermined wavelength range or may convert the color of the source light. Some light control patterns may also change the characteristics of light without changing the color of the source light.

SUMMARY

The disclosure provides an optical member having reduced external light reflectance and improved color reproducibility.

The disclosure also provides a display panel having improved color tone by reducing the reflectance of external light on the surface of the display panel and improving the color reproducibility.

An embodiment of the invention provides a display panel including: a light-emitting element which outputs source light and includes a first electrode, a light-emitting layer disposed on the first electrode, and a second electrode disposed on the light-emitting layer; a light control layer disposed on the light-emitting element and including a first light control pattern which converts the source light into first light, and a second light control pattern which transmits the source light; and a color filter layer disposed on the light control layer and including a first color filter overlapping the first light control pattern, and a second color filter overlapping the second light control pattern, where the first color filter has a light transmittance of about 70% or less in a wavelength range of about 600 nanometers (nm) to about 640 nm, and the second color filter has a light transmittance of about 75% or less in a wavelength range of about 430 nm to about 470 nm.

In an embodiment, the first color filter may include a point at which the light transmittance is about 10% in a wavelength range of about 590 nm to about 610 nm.

In an embodiment, the first color filter may have a transmittance of less than about 10% in a wavelength range of about 590 nm or less.

In an embodiment, the transmittances of the first color filter and the second color filter may be measured through a spectrometer.

In an embodiment, the second color filter may have a full width of half maximum of a light transmittance spectrum of about 95 nm or less.

In an embodiment, a wavelength of the first light may be longer than a wavelength of the source light, and the first light control pattern may include first quantum dots which converts the source light into the first light.

In an embodiment, the first color filter may include a red colorant, and the second color filter may include a blue colorant.

In an embodiment, the first color filter may further include a black colorant, and the black colorant may be included in an amount of about 1 wt % or less with respect to a total weight of the red colorant and the black colorant.

In an embodiment, the second color filter further may include a purple colorant, and a weight ratio of the blue colorant to the purple colorant may be in a range of about 70:30 to about 80:20.

In an embodiment, the first color filter may have a thickness in a range of about 3 micrometers (μm) to about 5.5 μm, and the second color filter may have a thickness in a range of about 1.8 μm to about 4.2 μm.

In an embodiment, the display panel may further include a base substrate disposed below the light-emitting element; and a base layer disposed on the color filter layer.

In an embodiment, the display panel may further include an anti-reflection layer disposed on the base layer.

In an embodiment, the light-emitting element may receive unpolarized incident light from above the anti-reflection layer.

In an embodiment, the color filter layer may further include a low refractive index layer disposed between the light control layer and the first and second color filters, and a refractive index of the low refractive layer may be about 1.3 or less.

In an embodiment, the light-emitting element may be disposed between the first electrode and the second electrode, and may include a plurality of light-emitting stacks each having the light-emitting layer.

In an embodiment, the plurality of light-emitting stacks may include a first light-emitting stack disposed on the first electrode and including a first light-emitting layer, a charge generation layer disposed on the first light-emitting stack, and a second light-emitting stack disposed on the charge generation layer and including a second light-emitting layer, and the first light-emitting layer emits light of a color different from light emitted from the second light-emitting layer.

In an embodiment of the invention, an optical member includes a light control layer including a first light control pattern including quantum dots which converts the wavelength of incident light and a second light control pattern which transmits the incident light; a color filter layer disposed on the light control layer and including a first color filter overlapping the first light control pattern, and a second color filter overlapping the second light control pattern, where the first color filter has a light transmittance of about 70% or less in a wavelength range of about 600 nm to about 640 nm, and the second color filter has a light transmittance of about 75% or less in a wavelength range of about 430 nm to about 470 nm.

In an embodiment, a thickness of the first color filter may be greater than a thickness of the second color filter.

In an embodiment of the invention, a display panel includes a lower panel including a display element layer and an encapsulation layer disposed on the display element layer; an upper panel disposed on the lower panel; and a filling layer disposed between the lower panel and the upper panel, where the upper panel includes a light control layer disposed on the filling layer and including a first light control pattern which converts source light into first light and a second light control pattern which transmits the source light, and a color filter layer disposed on the light control layer and including a first color filter overlapping the first light control pattern, and a second color filter overlapping the second light control pattern, and the first color filter has a thickness in a range of about 3 μm to about 5.5 μm, and the second color filter has a thickness in a range of about 1.8 μm to about 4.2 μm.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
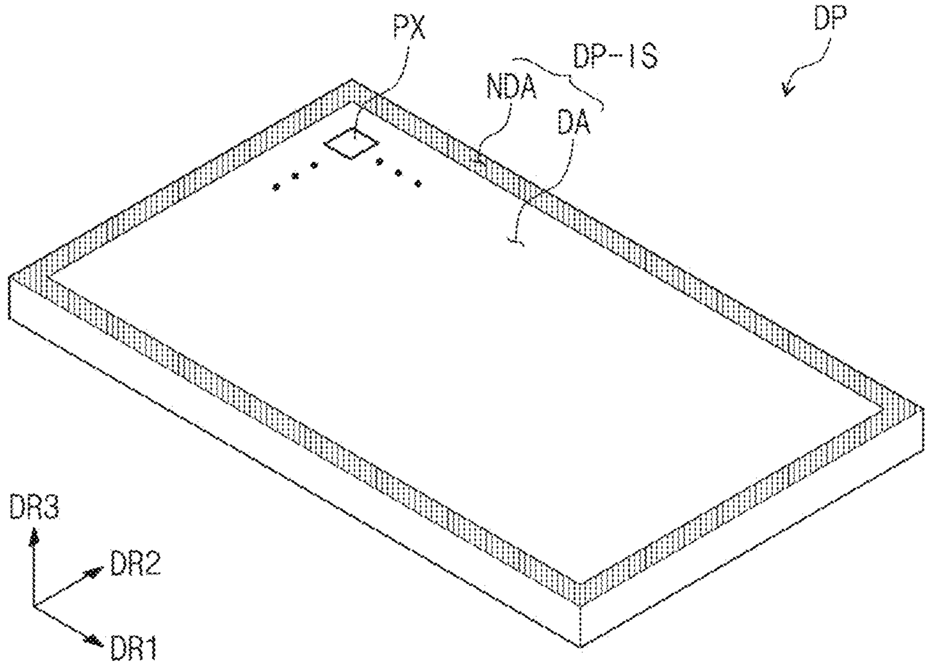
FIG. 1A is a perspective view of a display panel according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when a component (a region, a layer, a portion, or the like) is referred to as "being on", "being connected to", or "being coupled to" another component, it may be directly connected/coupled to another component, or an intervening third component may be also disposed therebetween.

Like numbers refer to like elements throughout. Also, in the drawings, the thicknesses, ratios, and dimensions of the elements are exaggerated for effective description of the technical contents. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Although the terms first, second, etc. may be used herein to describe various elements, these elements should not be limited by these terms. These terms are only used to distinguish one element from another element. For example, a first element may be referred to as a second element, and similarly, a second element may also be referred to as a first element without departing from the scope of the disclosure. The singular forms include the plural forms as well, unless the context clearly indicates otherwise.

Also, terms such as "below", "lower", "above", and "upper" may be used to describe the relationships of the components illustrated in the drawings. These terms have a relative concept and are described on the basis of the directions indicated in the drawings.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "directly disposed", there is no additional layer, film, region, plate, or the like added between the portion of the layer, film, region, for example, "directly disposed" may mean disposing without additional members such as adhesive members between two layers or two members for example, "directly disposed" may mean disposing without additional members such as adhesive members between two layers or two members.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
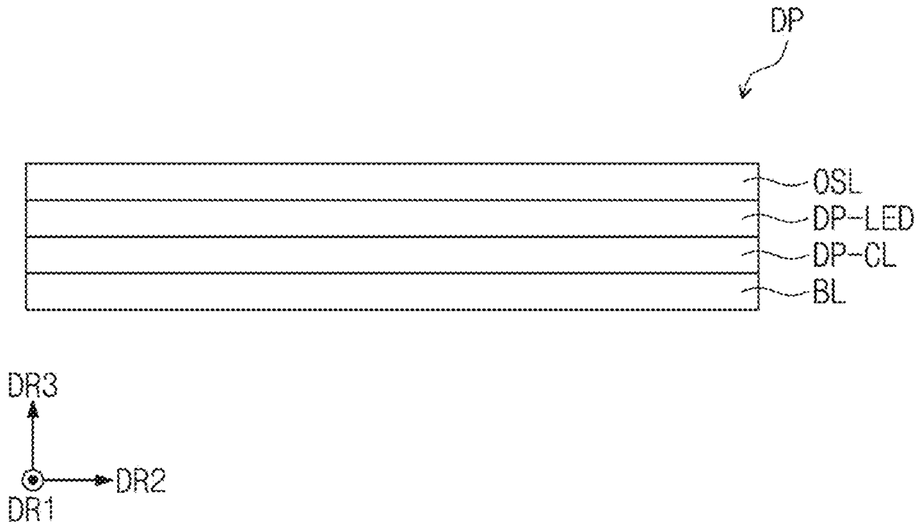
FIG. 1B is a cross-sectional view of a display panel according to an embodiment of the invention.
Figure 1C:
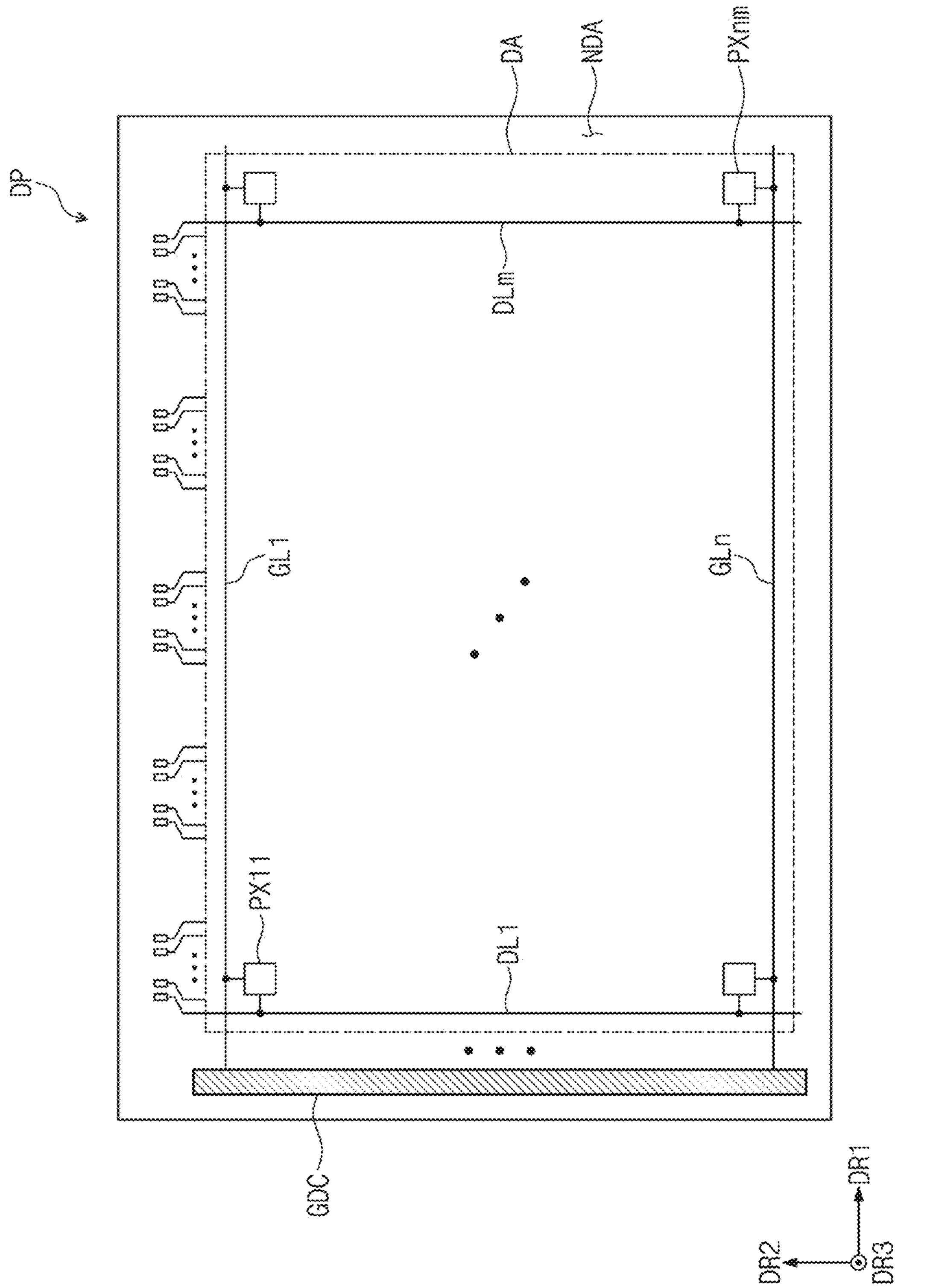
FIG. 1C is a plan view of a display panel according to an embodiment of the invention.

FIG. 1A is a perspective view of a display panel according to an embodiment of the invention. FIG. 1B is a cross-sectional view of a display panel according to an embodiment of the invention. FIG. 1C is a plan view of a display panel according to an embodiment of the invention.

As illustrated in FIG. 1A, an embodiment of the display panel DP may display an image IM through a display surface DP-IS. The display surface DP-IS is parallel to a plane defined by a first direction DR1 and a second direction DR2. The display surface DP-IS may include a display region DA and a non-display region NDA. A pixel PX is disposed in the display region DA, but is not disposed in the non-display region NDA. The non-display region NDA is defined along an edge of the display surface DP-IS. The non-display region NDA may surround the display region DA. However, an embodiment of the invention is not limited thereto, and at least a portion of the non-display region NDA may be omitted or disposed on only one side of the display region DA.

A normal direction of the display surface DP-IS, that is, a thickness direction of the display panel DP, is indicated as a third direction DR3. A front surface (or an upper surface) and a rear surface (or a lower surface) of each layer or each unit to be described below are distinguished based on the third direction DR3. However, the first to third directions DR1, DR2, and DR3 illustrated in an embodiment are merely examples.

In an embodiment, as shown in FIG. 1A, the display panel DP may have a flat display surface DP-IS, but an embodiment of the invention is not limited thereto. Alternatively, the display panel DP may include a curved display surface or a three-dimensional display surface. The three-dimensional display surface may include a plurality of display regions indicating directions different from each other.

As illustrated in FIG. 1B, an embodiment of the display panel DP includes a base substrate BS, a circuit element layer DP-CL, a display element layer DP-LED, and an optical structure layer OSL. The base substrate BS may include a synthetic resin substrate or a glass substrate. The circuit element layer DP-CL includes at least one insulating layer and a circuit element. The circuit element includes a signal line, a driving circuit of a pixel, and the like. The circuit element layer DP-CL may be formed through a process of forming an insulating layer, a semiconductor layer, and a conductive layer by coating, vapor deposition, etc., and a process of patterning the insulating layer, the semiconductor layer, and the conductive layer by photolithography. A display element layer DP-LED includes at least one display element. The optical structure layer OSL may convert the color of light provided from the display element. The optical structure layer OSL may include a light control pattern or a structure for increasing light conversion efficiency.

FIG. 1C illustrates a planar arrangement relationship of signal lines GL1 to GLn and DL1 to DLm and pixels PX11 to PXnm. Here, n and m are natural numbers. The signal lines GL1 to GLn and DL1 to DLm may include a plurality of gate lines GL1 to GLn and a plurality of data lines DL1 to DLm.

Each of the pixels PX11 to PXnm is connected to a corresponding gate line among the plurality of gate lines GL1 to GLn and a corresponding data line among the plurality of data lines DL1 to DLm. Each of the pixels PX11 to PX may include a pixel driving circuit and a display element. More various types of signal lines may be further provided in the display panel DP according to the configuration of the pixel driving circuits of the pixels PX11 to PXnm.

In an embodiment, the pixels PX11 to PXnm may be arranged in a matrix form, but an embodiment of the invention is not limited thereto. Alternatively, the pixels PX11 to PXnm may be arranged in a Pentile® form. In an embodiment, for example, points at which the pixels PX11 to PXnm are disposed may correspond to vertices of a diamond shape or a rhombus shape. In an embodiment, a gate driving circuit GDC may be integrated on the display panel DP through an oxide silicon gate (OSG) driver circuit process or an amorphous silicon gate (ASG) driver circuit process.

Figure 2A:
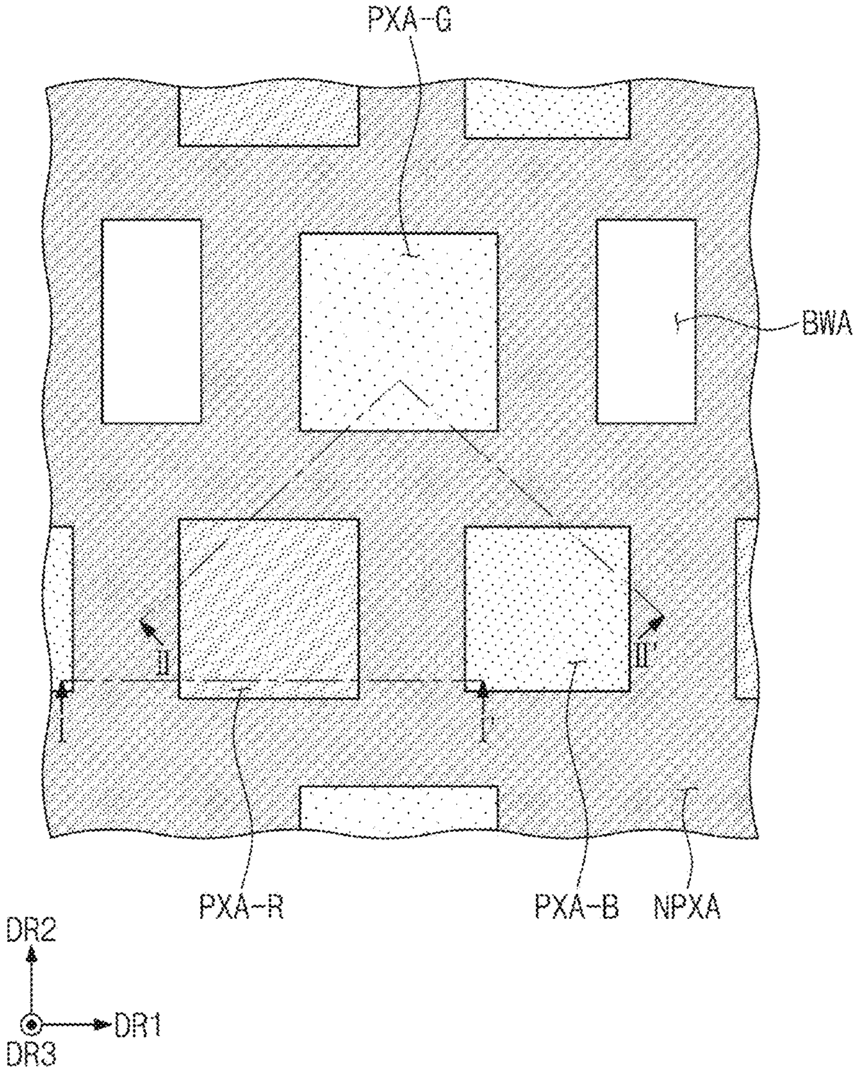
FIG. 2A is an enlarged plan view of a portion of a display panel according to an embodiment of the invention.

FIG. 2A is an enlarged plan view of a portion of a display panel according to an embodiment of the invention. FIG. 2A exemplarily illustrates a plane including three pixel regions PXA-R, PXA-B, and PXA-G and a bank well region BWA adjacent thereto in the display panel DP according to an embodiment of the invention. In an embodiment of the invention, the three types of pixel regions PXA-R, PXA-B, and PXA-G illustrated in FIG. 2A may be repeatedly disposed throughout the display region DA.

A peripheral region NPXA is disposed around the first to third pixel regions PXA-R, PXA-B, and PXA-G. The peripheral region NPXA sets boundaries between the first to third pixel regions PXA-R, PXA-B, and PXA-G. The peripheral region NPXA may surround the first to third pixel regions PXA-R, PXA-B, and PXA-G. A structure that prevents color mixing between the first to third pixel regions PXA-R, PXA-B, and PXA-G, for example, a pixel defining film PDL (see FIG. 2B) or bank BMP (see FIG. 2B) may be disposed in the peripheral region NPXA.

FIG. 2A exemplarily illustrates an embodiment where the first to third pixel regions PXA-R, PXA-B, and PXA-G have a same planar shape as each other and have different planar areas from each other, but an embodiment of the invention is not limited thereto. Alternatively, areas of at least two of the first to third pixel regions PXA-R, PXA-B, and PXA-G may be equal to each other. In such an embodiment, areas of the first to third pixel regions PXA-R, PXA-B, and PXA-G may be set according to the color of emitted light. In an embodiment, for example, the pixel region that emits light of red color among primary colors may have the largest area, and the pixel region that emits light of blue color among primary colors may have the smallest area.

FIG. 2A illustrates an embodiment where each of the first to third pixel regions PXA-R, PXA-B, and PXA-G has a rectangular shape, but an embodiment of the invention is not limited thereto. Alternatively, in a plan view, the first to third pixel regions PXA-R, PXA-B, and PXA-G may have other polygonal shapes (including substantially polygonal shapes) such as a rhombus or a pentagon. In an embodiment, the first to third pixel regions PXA-R, PXA-B, and PXA-G may have a rectangular shape (a substantially rectangular shape) having rounded corners on a plane.

FIG. 2A exemplarily illustrates an embodiment where the third pixel region PXA-G is disposed in a first row, and the first pixel region PXA-R and the second pixel region PXA-B are disposed in a second row, but an embodiment of the invention is not limited thereto. The arrangement of the first to third pixel regions PXA-R, PXA-B, and PXA-G may be variously changed. In an embodiment, for example, the first to third pixel regions PXA-R, PXA-B, and PXA-G may be arranged in the same row.

In an embodiment, one of the first to third pixel regions PXA-R, PXA-B, and PXA-G provides second light corresponding to part of source light, another of the first to third pixel regions PXA-R, PXA-B, and PXA-G provides first light different from the second light, and the other of the first to third pixel regions PXA-R, PXA-B, and PXA-G provides third light different from the first light and the second light. In such an embodiment, the second pixel region PXA-B provides the second light corresponding to part of the source light. In an embodiment, for example, the first pixel region PXA-R may provide red light, the second pixel region PXA-B may provide blue light, and the third pixel region PXA-G may provide green light.

The bank well region BWA may be defined in the display region DA (FIG. 1A). The bank well region BWA may be a region in which the bank well BW (FIG. 5) is formed to prevent defects caused by incorrect patterning of the plurality of light control patterns CCP-R, CCP-B, CCP-G (see FIG. 2C) in the process of patterning the plurality of light control patterns CCP-R, CCP-B, CCP-G (see FIG. 2C) included in the light control layer CCL (see FIG. 2C). In such an embodiment, the bank well region BWA may be a region in which a bank well formed by removing a portion of the bank BMP (see FIG. 2C) is defined.

FIG. 2A exemplarily illustrates an embodiment where the two bank well regions BWA are defined to be adjacent to the third pixel regions PXA-G, but an embodiment of the invention is not limited thereto, and alternatively, the shape and arrangement of the bank well regions BWA may be variously changed.

Figure 2B:
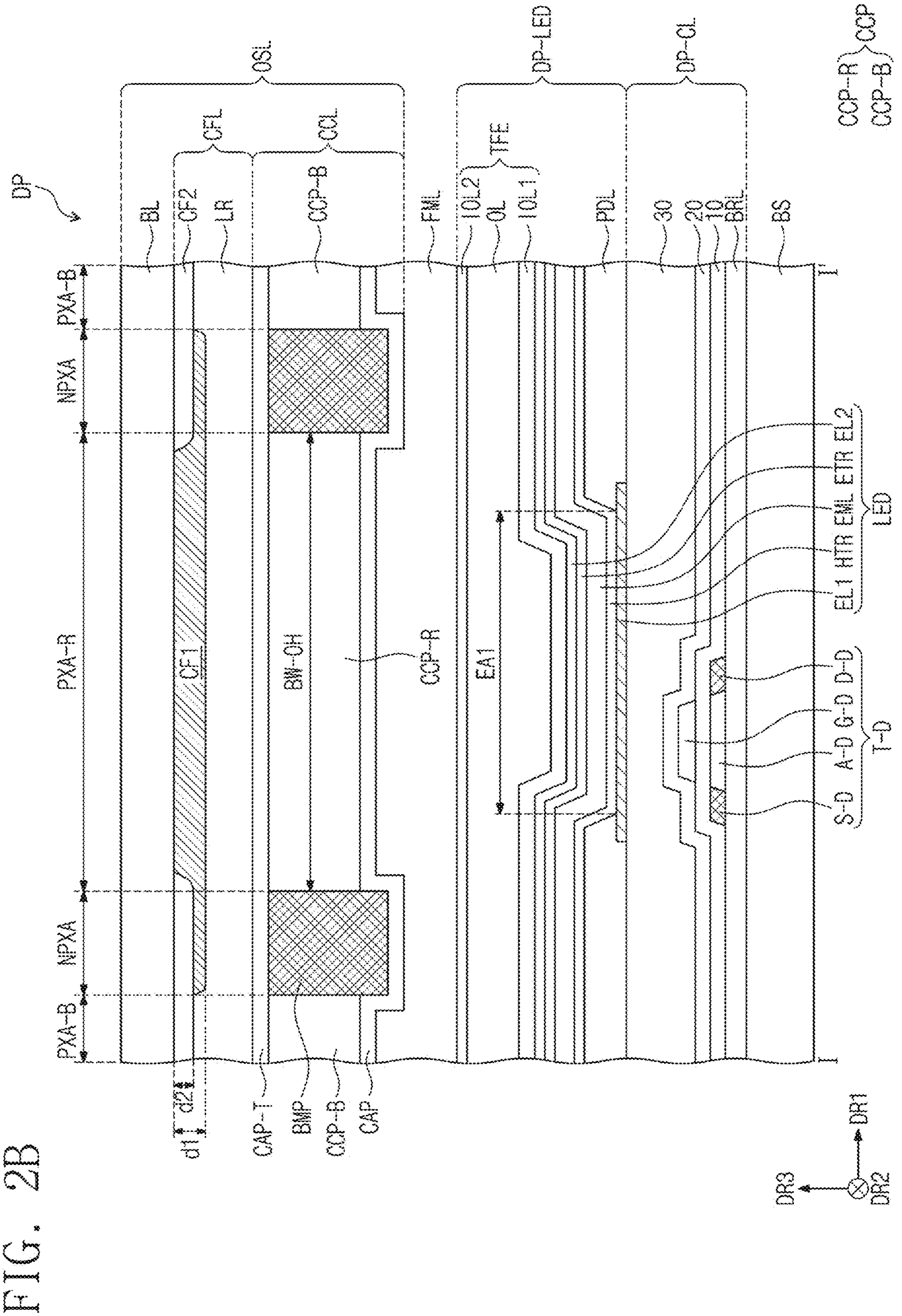
FIG. 2B is a cross-sectional view of a display panel according to an embodiment of the invention.
Figure 2C:
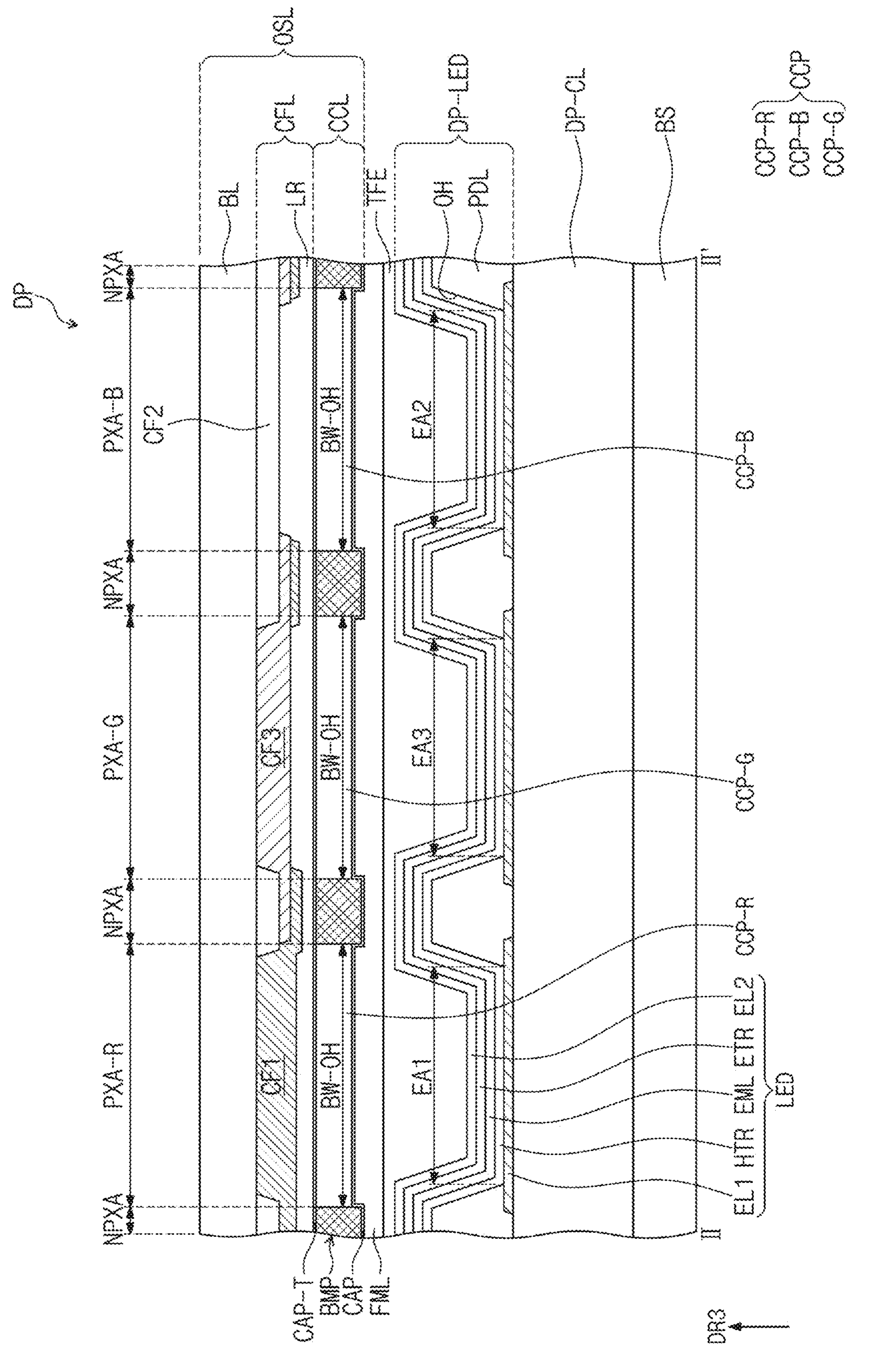
FIG. 2C is an enlarged view of a partial region of a cross-section of a display panel according to an embodiment of the invention.
Figure 3:
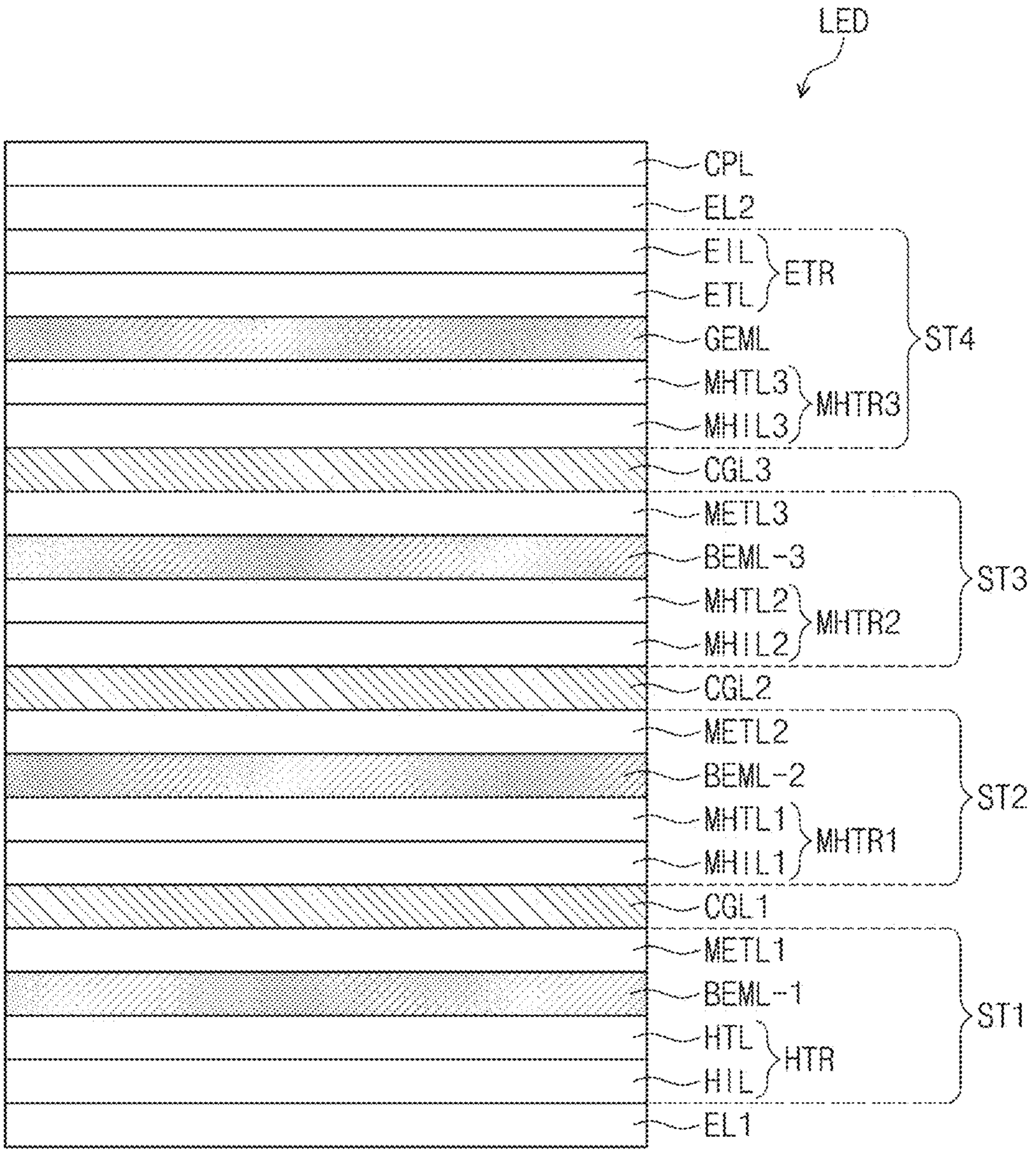
FIG. 3 is a cross-sectional view of a light-emitting element included in a display panel according to an embodiment of the invention.

FIG. 2B is a cross-sectional view of a display panel according to an embodiment of the invention. FIG. 2C is an enlarged view of a partial region of a cross-section of a display panel according to an embodiment of the invention. FIG. 3 is a cross-sectional view of a light-emitting element included in a display panel according to an embodiment of the invention. FIG. 2B illustrates a cross-section taken along line of FIG. 2A. FIG. 2C illustrates a cross-section taken along line II-IP of FIG. 2A.

Referring to FIG. 2B, an embodiment of the display panel DP may include a base substrate BS, a circuit element layer DP-CL disposed on the base substrate BS, and a display element layer DP-LED disposed on the circuit element layer DP-CL. In this specification, the base substrate BS, the circuit element layer DP-CL, and the display element layer DP-LED may be collectively referred to as a lower panel, a lower display substrate, or a display member.

The base substrate BS may be a member that provides a base surface on which components included in the circuit element layer DP-CL are disposed. In an embodiment, the base substrate BS may be a glass substrate, a metal substrate, a polymer substrate, or the like. However, an embodiment of the invention is not limited thereto, and alternatively, the base substrate BS may be an inorganic layer, a functional layer, or a composite material layer.

The base substrate BS may have a multilayer structure. In an embodiment, for example, the base substrate BS may have a three-layer structure of a polymer resin layer, a barrier layer, and a polymer resin layer. In such an embodiment, the polymer resin layer may include polyimide-based resin. In such an embodiment, the polymer resin layer may include at least one selected from an acrylic resin, a methacrylic resin, a polyisoprene-based resin, a vinyl-based resin, an epoxy-based resin, a urethane-based resin, a cellulose-based resin, a siloxane-based resin, a polyamide-based resin, and a perylene-based resin. In this specification, a "α-based" resin may be considered as including a functional group of "α". In an embodiment, the barrier layer may be an inorganic layer including an inorganic material.

The circuit element layer DP-CL may be disposed on the base substrate BS. The circuit element layer DP-CL may include a transistor T-D as a circuit element. The configuration of the circuit element layer DP-CL may vary according to the design of the driving circuit of the pixel PX (see FIG. 1A), and one transistor T-D is illustrated in FIG. 2B as an example. An arrangement relationship of an active A-D, a source S-D, a drain D-D, and a gate G-D, which constitute the transistor T-D, are illustrated by way of example. The active A-D, the source S-D, and the drain D-D may be regions divided according to the doping concentration or conductivity of the semiconductor pattern.

The circuit element layer DP-CL may include a lower buffer layer BRL, a first insulating layer 10, a second insulating layer 20, and a third insulating layer 30 that are disposed on the base substrate BS. In an embodiment, for example, the lower buffer layer BRL, the first insulating layer 10, and the second insulating layer 20 may be inorganic layers, and the third insulating layer 30 may be an organic layer.

The display element layer DP-LED may include a light-emitting element LED as a display element. The light-emitting element LED may generate the source light described above. The light-emitting element LED includes a first electrode EL1, a second electrode EL2, and a light-emitting layer EML disposed therebetween. In an embodiment, the light-emitting element LED may include an organic light-emitting diode as a light-emitting element. In an alternative embodiment of the invention, the light-emitting element may include a quantum dot light-emitting diode. In such an embodiment, the light-emitting layer EML included in the light-emitting element LED may include an organic light-emitting material as a light-emitting material, or the light-emitting layer EML may include quantum dots as a light-emitting material. Alternatively, the display element layer DP-LED may include an ultra-small light-emitting element to be described later as a light-emitting element. The ultra-small light-emitting element may include, for example, a micro light-emitting element and/or nano light-emitting element, and the like. The micro or nano light-emitting element may be a light-emitting element having a micro- or nano-scale size and including an active layer disposed between a plurality of semiconductor layers.

The first electrode EL1 is disposed on the third insulating layer 30. The first electrode EL1 may be directly or indirectly connected to the transistor T-D, and a connection structure between the first electrode EL1 and the transistor T-D is not illustrated in FIG. 2B.

The display element layer DP-LED includes the pixel defining film PDL. In an embodiment, for example, the pixel defining film PDL may be an organic layer. A light-emitting opening OH (see FIG. 2C) is defined in the pixel defining film PDL. The light-emitting opening OH of the pixel defining film PDL allows at least a portion of the first electrode EL1 to be exposed. In such an embodiment, a first light-emitting region EA1 may be defined by the light-emitting opening OH.

A hole control layer HTR, the light-emitting layer EML, and an electron control layer ETR overlap at least the pixel region PXA-R. Each of the hole control layer HTR, the light-emitting layer EML, the electron control layer ETR, and the second electrode EL2 may be disposed, in common, in the first to third pixel regions PXA-R, PXA-B, and PXA-G (see FIG. 2C). Each of the hole control layer HTR, the light-emitting layer EML, the electron control layer ETR, and the second electrode EL2 that overlap the first to third pixel regions PXA-R, PXA-B, and PXA-G (FIG. 2C) may have an integral shape, that is, integrally formed as a single unitary and indivisible part. However, an embodiment of the invention is not limited thereto, and alternatively, at least one of the hole control layer HTR, the light-emitting layer EML, or the electron control layer ETR may be formed separately for each of the first to third pixel regions PXA-R, PXA-B, and PXA-G (see FIG. 2C). In an embodiment, the light-emitting layer EML may be patterned in the light-emitting opening OH, and formed separately for each of the first to third pixel regions PXA-R, PXA-B, and PXA-G (see FIG. 2C).

The hole control layer HTR may include a hole transport layer and may further include a hole injection layer.

The light-emitting layer EML may generate the third light that is the source light. The light-emitting layer EML may generate blue light. The blue light may include light having a wavelength of about 410 nanometers (nm) to about 480 nm. An emission spectrum of the blue light may have a maximum peak in a wavelength range of about 440 nm to about 460 nm.

The electron control layer ETR may include an electron transport layer and may further include an electron injection layer.

The display element layer DP-LED may include a thin film encapsulation layer TFE that protects the second electrode EL2. The thin film encapsulation layer TFE may include an organic material or an inorganic material. The thin film encapsulation layer TFE may have a multilayer structure in which an inorganic layer and an organic layer are repeatedly or alternately disposed one on another. In an embodiment, the thin film encapsulation layer TFE may include a first inorganic encapsulation layer IOL1/an organic encapsulation layer OL/a second inorganic encapsulation layer IOL2. The first and second inorganic encapsulation layers IOL1 and IOL2 may protect the light-emitting element LED from external moisture, and the organic encapsulation layer OL may prevent dent defects on the light-emitting element LED caused by foreign substances introduced during the manufacturing process. Although not illustrated, the display panel DP may further include a refractive index control layer on an upper side of the thin film encapsulation layer TFE to improve light output efficiency.

As illustrated in FIG. 2B, the optical structure layer OSL is disposed on the thin film encapsulation layer TFE. The optical structure layer OSL may include a light control layer CCL, a color filter layer CFL, and a base layer BL. In this specification, the optical structure layer OSL may be referred to as an upper panel, an upper display substrate, or an optical member.

The light control layer CCL may be disposed on the display element layer DP-LED including the light-emitting element LED. The light control layer CCL may include a bank BMP, light control patterns CCP, and barrier layers CAP and CAP-T.

The bank BMP may include a base resin and an additive. The base resin may include or be formed of various resin compositions, which may be generally referred to as a binder. The additive may include a coupling agent and/or a photo-initiator. The additive may further include a dispersant.

The bank BMP may include a black coloring agent to block light. The bank BMP may include a black dye or black pigment mixed with a base resin. In an embodiment, the black coloring agent may include carbon black, a metal such as chromium, or an oxide thereof.

In an embodiment, a bank opening BW-OH corresponding to the light-emitting opening OH is defined by the bank BMP. In a plan view, the bank opening BW-OH overlaps the light-emitting opening OH and has a larger area than the light-emitting opening OH. In such an embodiment, the bank opening BW-OH may have a larger area than the light-emitting region EA1 defined by the light-emitting opening OH. In the specification, the wording "corresponding" means that the two components overlap when viewed in the thickness direction DR3 of the display panel DP, and is not limited to the two components having a same area as each other.

The light control patterns CCP are disposed inside the bank opening BW-OH. A light control pattern CCP-R, or at least a portion of the plurality of the light control patterns CCP, may change the optical properties of the source light.

The light control pattern CCP-R may include quantum dots for changing the optical properties of the source light. The light control pattern CCP-R may include quantum dots that convert the source light into light having a different wavelength from the source light. In the light control pattern CCP-R overlapping the first pixel region PXA-R, the quantum dots may convert the source light including blue light into red light.

The quantum dots may have a core-shell structure, and the core of the quantum dots is a group II-VI compound, a group III-VI compound, a group compound, a group III-V compound, a group IV-VI compound, and a group IV element, group IV compounds, and combinations thereof.

The group II-VI compound may be at least one selected from: a binary compound selected from CdSe, CdTe, CdS, ZnS, ZnSe, ZnTe, ZnO, HgS, HgSe, HgTe, MgSe, MgS and a mixture thereof a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The group III-VI compound may include a binary compound such as $In_2S_3$ and $In_2Se_3$, a ternary compound such as $InGaS_3$ and $InGaSe_3$, or any combination thereof.

The group compound may be at least one selected from a ternary compound such as AgInS, $AgInS_2$, CuInS, $CuTnS_2$, $AgGaS_2$, $CuGaS_2$ $CuGaO_2$, $AgGaO_2$, $AgA_1O_2$ and a mixture thereof, or a quaternary compound such as $AgInGaS_2$, $CuInGaS_2$.

The group III-V compound may be at least one selected from: a binary compound selected from GaN, GaP, GaAs, GaSb, AlN, AlP, AlAs, AlSb, InN, InP, InAs, InSb, and a mixture thereof a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and a mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. Meanwhile, the group III-V compound may further include a group II metal. In an embodiment, for example, InZnP or the like may be selected as the group III-II-V compound.

The group IV-VI compound may be at least one selected from: a binary compound selected from SnS, SnSe, SnTe, PbS, PbSe, PbTe and a mixture thereof a ternary compound selected from SnSeS, SnSeTe, SnSTe, PbSeS, PbSeTe, PbSTe, SnPbS, SnPbSe, SnPbTe and a mixture thereof and a quaternary compound selected from SnPbSSe, SnPbSeTe, SnPbSTe and a mixture thereof. The group IV element may be selected from Si, Ge, and a mixture thereof. The group IV compound may be a binary compound selected from SiC, SiGe, and a mixture thereof.

In this case, the binary compound, the ternary compound, or the quaternary compound may be present in the particle with a uniform concentration, or may be present in the same particle with partially different concentrations. In addition, a core/shell structure in which one quantum dot surrounds another quantum dot may also be possible. The core/shell structure has a concentration gradient in which the concentration of elements presents in the shell decreases toward the core.

In some embodiments, the quantum dots may have the above-described core-shell structure including a core that includes nanocrystals and a shell surrounding the core. The shell SL of the quantum dots may serve as a protective layer for maintaining semiconductor characteristics by preventing the core from being chemically modified, and/or serve as a charging layer for imparting electrophoretic characteristics to the quantum dots. The shell SL may be a single layer or a plurality of layers. In an embodiment, the shell of the quantum dots may include an oxide of metal or non-metal, a semiconductor compound, or a combination thereof.

In such an embodiment, for example, the oxide of the metal or non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, $CoMn_2O_4$, but an embodiment of the invention is not limited thereto.

In such an embodiment, for example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but an embodiment of the invention is not limited thereto.

The quantum dots may have, in an emission wavelength spectrum, a full width of half maximum (FWHM) of about 45 nm or less, e.g., a FWHM of about 40 nm or less, or a FWHM of about 30 nm or less, such that the color purity or the color reproducibility may be improved. In an embodiment, light emitted through such the quantum dots are emitted in all directions, so that wide viewing angle characteristics may be improved.

In an embodiment, shapes of the quantum dots are not particularly limited to a shape commonly used in the field, but, more specifically, the quantum dots may have a shape such as a spherical shape, a pyramidal shape, a multi-arm shape, or a cubic nanoparticle, a nanotube, a nanowire, a nanofiber, and a nanoplatelet particle.

The quantum dots may control the color of emitted light according to the particle size, and accordingly, the quantum dots may have various emission colors such as blue, red, and green. In an embodiment, the quantum dots included in the light control pattern CCP-R overlapping the first pixel region PXA-R may have a red emission color. As the particle size of the quantum dots is smaller, the quantum dots may emit light in a shorter wavelength range. In an embodiment, for example, among the quantum dots with a same core, the particle size of the quantum dots that emit green light may be smaller than the particle size of the quantum dots that emit red light. In an embodiment, among the quantum dots with a same core, the particle size of quantum dots that emit blue light may be smaller than the particle size of quantum dots that emit green light. However, an embodiment of the invention is not limited thereto, and even in the quantum dots having a same core, the particle size may be controlled according to a shell forming material and a shell thickness.

In an embodiment, where the quantum dots have various emission colors such as blue, red, and green, the quantum dots having different emission colors may have different core materials from each other.

The light control pattern CCP-R may further include scatterers. The light control pattern CCP-R may include quantum dots that convert the source light into red light, and scatterers that scatter light.

The scatterers may be inorganic particles. In an embodiment, for example, the scatterers may include at least one selected from $TiO_2$, ZnO, $Al_2O_3$, $SiO_2$, and hollow silica. The scatterers may include any one selected from $TiO_2$, ZnO, $Al_2O_3$, $SiO_2$, and hollow silica, or a mixture of two or more materials selected from among $TiO_2$, ZnO, $Al_2O_3$, $SiO_2$, and hollow silica.

The light control pattern CCP-R may include a base resin for dispersing the quantum dots and the scatterers. The base resin may be a medium in which the quantum dots and the scatterers are dispersed, and may include or be formed of various resin compositions which may be generally referred to as a binder. In an embodiment, for example, the base resin may be an acrylic resin, a urethane-based resin, a silicon-based polymer, an epoxy-based resin, or the like. The base resin may be a transparent resin.

In an embodiment, the light control pattern CCP-R may be formed through an inkjet process. In such an embodiment, a liquid composition is provided in the bank opening BW-OH. A composition that is polymerized by a thermal curing process or a photo-curing process is reduced in volume after curing.

A stepped portion may defined at a boundary between an upper surface of the bank BMP and an upper surface of the light control pattern CCP-R. In an embodiment, the upper surface of the bank BMP may be defined to be higher than the upper surface of the light control pattern CCP-R. A difference in height between the upper surface of the bank BMP and the upper surface of the light control pattern CCP-R may be, for example, in a range of about 2 μm to about 3 μm.

The light control layer CCL may further include a barrier layer CAP and CAP-T disposed on an upper portion or a lower portion of the light control pattern CCP-R. The barrier layer CAP and CAP-T may serve to prevent moisture and/or oxygen (hereinafter, referred to as moisture/oxygen). The barrier layer CAP and CAP-T may be disposed on the upper portion and the lower portion of the light control pattern CCP-R to block the light control patterns CCP-R, CCP-B, and CCP-G from being exposed to moisture/oxygen.

The barrier layer may include a first barrier layer CAP adjacent to the display element layer DP-LED and a second barrier layer CAP-T spaced apart from the display element layer DP-LED with the light control pattern CCP-R therebetween. The first barrier layer CAP may cover one surface of the light control pattern CCP-R adjacent to the display element layer DP-LED, and the second barrier layer CAP-T may cover another surface of the light control pattern CCP-R adjacent to the color filter layer CFL. In such an embodiment, the barrier layers CAP and CAP-T may cover the bank BMP as well as the light control pattern CCP-R.

The first barrier layer CAP may be disposed along a stepped portion between the bank BMP and the light control pattern CCP-R. The second barrier layer CAP-T may cover one surface of the bank BMP and one surface of the light control pattern CCP-R adjacent to the color filter layer CFL. The second barrier layer CAP-T may be directly disposed under a low refractive index layer LR.

The barrier layer CAP and CAP-T may include at least one inorganic layer. In such an embodiment, the barrier layer CAP and CAP-T may include an inorganic material. In an embodiment, for example, the barrier layers CAP and CAP-T may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or include a metal thin film with sufficient light transmittance. In an embodiment, for example, the first barrier layer CAP disposed under the light control pattern CCP-R includes a silicon oxynitride, and the second barrier layer CAP-T disposed on the light control pattern CCP-R may include a silicon oxide. However, an embodiment of the invention is not limited thereto. In an embodiment, the barrier layer CAP and CAP-T may further include an organic film. The barrier layers CAP and CAP-T may be formed of or defined by a single layer or a plurality of layers. In the barrier layer CAP and CAP-T, the inorganic film may protect the light control pattern CCP-R from external moisture, and the organic film may remove the stepped portion defined by the bank BMP and the light control pattern CCP-R to provide a flat base surface for a member to be disposed thereabove.

The color filter layer CFL is disposed on the light control layer CCL. The color filter layer CFL includes at least one color filter CF1. The color filter CF1 transmits light having a specific wavelength range and blocks light having a wavelength other than the specific wavelength range. The color filter CF1 of the first pixel region PXA-R may transmit red light and block green light and blue light.

The color filter CF1 includes a base resin and a dye and/or pigment dispersed in the base resin. The base resin may be a medium in which the dye and/or pigment is dispersed, and may include or be formed of various resin compositions which may be generally referred to as a binder. Hereinafter, the color filter CF1 will be described in detail.

The color filter CF1 may have a uniform thickness in the first pixel region PXA-R. The light, obtained by converting the source light including blue light into red light through the light control pattern CCP-R, may be provided to the outside with uniform luminance in the first pixel region PXA-R.

The color filter layer CFL may include the low refractive index layer LR. The low refractive index layer LR may be disposed between the light control layer CCL and the color filter CF1. The low refractive index layer LR may be disposed on the upper portion of the light control layer CCL to block the light control pattern CCP-R from being exposed to moisture/oxygen. In an embodiment, the low refractive index layer LR may serve as an optical functional layer that is disposed between the light control pattern CCP-R and the color filter CF1 to increase light extraction efficiency or prevent reflected light from being incident on the light control layer CCL. The low refractive index layer LR may have a smaller refractive index than a layer adjacent thereto.

The low refractive index layer LR may have a low refractive index, and may be a mixed layer of an organic material and an inorganic material. In an embodiment, the low refractive index layer LR may include a polymer resin, and the inorganic particles may be dispersed in the polymer resin. The polymer resin included in the low refractive index layer LR may be, for example, a silicone resin and/or an acrylic silicone resin. The inorganic particles included in the low refractive index layer LR may be, for example, hollow sphere silica and/or porogen. However, an embodiment of the invention is not limited thereto, and alternatively, the low refractive index layer LR may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or include a metal thin film with sufficient light transmittance. The low refractive index layer LR may be formed of or defined by a single layer or a plurality of layers.

The low refractive index layer LR may have a low refractive index of about 1.3 or less. In an embodiment, the refractive index of the low refractive index layer LR may be about 1.2. The low refractive index layer LR may have a refractive index of about 1.3 or less in a wavelength range of about 400 nm to about 700 nm, which is a visible light range.

In an embodiment of the display device DD, the color filter CF1 of the color filter layer CFL may be directly disposed on the light control layer CCL. In such an embodiment, the low refractive index layer LR may be omitted.

In an embodiment, the display panel DP may further include a base layer BL disposed on the color filter layer CFL. The base layer BL may be a member that provides a base surface on which the color filter layer CFL, the light control layer CCL, and the like are disposed. The base layer BL may be a glass substrate, a metal substrate, a plastic substrate, or the like. However, an embodiment is not limited thereto, and alternatively, the base layer BL may be an inorganic layer, an organic layer, or a composite material layer. In another alternative embodiment, the base layer BL may be omitted.

Although not illustrated, an anti-reflection layer may be disposed on the base layer BL. The anti-reflection layer may be a layer that reduces the reflectance of external light incident from the outside. The anti-reflection layer may be a layer that selectively transmits light emitted from the display panel DP. In an embodiment, the anti-reflection layer may be a single layer including a dye and/or a pigment dispersed in a base resin. The anti-reflection layer may be provided as one continuous layer that overlaps the entire surfaces of the first to third pixel regions PXA-R, PXA-B, and PXA-G (see FIG. 2C).

In an embodiment, the anti-reflection layer may not include a polarizing layer. Accordingly, light that passes through the anti-reflection layer and is incident on the side of the display element layer DP-LED may be unpolarized light. The display element layer DP-LED may receive unpolarized light from above (i.e., from thereabove and through) the anti-reflection layer.

In an embodiment, the display panel DP may include a lower panel having a display element layer DP-LED, and an upper panel (optical structure layer, OSL) including the light control layer CCL and the color filter layer CFL. In such an embodiment, a filling layer FML may be disposed between the lower panel and the upper panel OSL. In an embodiment, the filling layer FML may fill a space between the display element layer DP-LED and the light control layer CCL. The filling layer FML may be directly disposed on the encapsulation layer TFE, and the first barrier layer CAP included in the light control layer CCL may be disposed directly on the filling layer FML. A lower surface of the filling layer FML may contact an upper surface of the encapsulation layer TFE, and an upper surface of the filling layer FML may contact a lower surface of the first barrier layer CAP.

The filling layer FML may function as a buffer between a display element layer DP-LED and the light control layer CCL. In an embodiment, the filling layer FML may have a shock absorbing function, etc., and may increase the strength of the display panel DP. The filling layer FML may be formed from a filler resin including a polymer resin. In an embodiment, for example, the filling layer FML may be formed from a filling layer resin including an acrylic resin or an epoxy-based resin.

The filling layer FML may have a component distinct from the encapsulation layer TFE disposed therebelow and the first barrier layer CAP disposed thereabove, and the filling layer FML, the encapsulation layer TFE and the first barrier layer CAP may be respectively formed through separate processes. In an embodiment, the filling layer FML may include or be formed of a material different from those of the encapsulation layer TFE and the barrier layer CAP.

Referring to FIG. 2C, the display panel DP may include a base substrate BS and a circuit element layer DP-CL disposed on the base substrate BS. The circuit element layer DP-CL may be disposed on the base substrate BS. The circuit element layer DP-CL may include an insulating layer, a semiconductor pattern, a conductive pattern, a signal line, and the like. In an embodiment, the insulating layer, the semiconductor layer, and the conductive layer are formed on the base substrate BS through a coating or deposition method, and subsequently, the insulating layer, the semiconductor layer, and the conductive layer may be selectively patterned by performing a photolithography process multiple time, such that the semiconductor pattern, the conductive pattern, and the signal line included in the circuit element layer DP-CL may be formed. In an embodiment, the circuit element layer DP-CL may include a transistor, a buffer layer, and a plurality of insulating layers.

A light-emitting element LED according to an embodiment may include a first electrode EL1, a second electrode EL2 facing or disposed opposite to the first electrode EL1, and a light-emitting layer EML disposed between the first electrode EL1 and the second electrode EL2. The light-emitting layer EML included in the light-emitting element LED may include an organic light-emitting material or quantum dots as a light-emitting material. The light-emitting element LED may further include the hole control layer HTR and the electron control layer ETR. In an embodiment, although not shown, the light-emitting element LED may further include a capping layer (not shown) disposed on the second electrode EL2.

The pixel defining film PDL may be disposed on the circuit element layer DP-CL and cover a portion of the first electrode ELL A light-emitting opening OH is defined in the pixel defining film PDL. The light-emitting opening OH defined through the pixel defining film PDL allows at least a portion of the first electrode EL1 to be exposed. In an embodiment, the light-emitting regions EA1, EA2, and EA3 are defined corresponding to a partial region of the first electrode EL1 exposed by the light-emitting opening OH.

The display element layer DP-LED may include a first light-emitting region EA1, a second light-emitting region EA2, and a third light-emitting region EA3. The first light-emitting region EA1, the second light-emitting region EA2, and the third light-emitting region EA3 may be regions divided by the pixel defining film PDL. The first light-emitting region EA1, the second light-emitting region EA2, and the third light-emitting region EA3 may respectively correspond to a first pixel region PXA-R, a second pixel region PXA-B, and a third pixel region PXA-G.

The light-emitting regions EA1, EA2, and EA3 may overlap the pixel regions PXA-R, PXA-B, and PXA-G and may not overlap the bank well region BWA. In a plan view, the area of the pixel regions PXA-R, PXA-B, and PXA-G divided by the bank BMP may be larger than the area of the light-emitting regions EA1, EA2, and EA3 divided by the pixel defining film PDL.

In the light-emitting element LED, the first electrode EL1 is disposed on the circuit element layer DP-CL. The first electrode EL1 may be an anode or cathode. In addition, the first electrode EL1 may be a pixel electrode. The first electrode EL1 may be a transmissive electrode, a transflective electrode, or a reflective electrode.

The hole control layer HTR may be disposed between the first electrode EL1 and the light-emitting layer EML. The hole control layer HTR may include at least one selected from a hole injection layer, a hole transport layer, and an electron blocking layer. The hole control layer HTR may be disposed as a common layer to overlap the light-emitting regions EA1, EA2, and EA3 and the entirety of the pixel defining film PDL that separates the light-emitting regions EA1, EA2, and EA3. However, an embodiment of the invention is not limited thereto, and alternatively, the hole control layer HTR may be provided through patterning so that the hole control layer HTR is separately disposed corresponding to each of the light-emitting regions EA1, EA2, and EA3.

The light-emitting layer EML is disposed on the hole control layer HTR. In an embodiment, the light-emitting layer EML may be provided as a common layer to overlap the light-emitting regions EA1, EA2, and EA3 and the entirety of the pixel defining film PDL that separates the light-emitting regions EA1, EA2, and EA3. In an embodiment, the light-emitting layer EML may emit blue light. The light-emitting layer EML may overlap all of the hole control layer HTR and the electron control layer ETR.

However, an embodiment of the invention is not limited thereto, and in an alternative embodiment, the light-emitting layer EML may be disposed in the light-emitting opening OH. In such an embodiment, the light-emitting layers EML may be formed separately to correspond to the light-emitting regions EA1, EA2, and EA3 which are divided by the pixel defining film PDL. All of the light-emitting layers EML formed separately to correspond to the light-emitting regions EA1, EA2, and EA3 may emit blue light or may emit light having different wavelength ranges.

The light-emitting layer EML may have a single layer structure including or formed of a single material, a single layer structure including or formed of a plurality of materials different from each other, or a multi-layered structure that has a plurality of layers including or formed of a plurality of materials different from each other. The light-emitting layer EML may include a fluorescent or phosphorescent material. In the light-emitting element according to an embodiment, the light-emitting layer EML may include an organic light-emitting material, a metal organic complex, or quantum dots as a light-emitting material. FIGS. 2B and 2C exemplarily illustrate an embodiment where a light-emitting element LED includes a single light-emitting layer EML, but in an alternative embodiment, the light-emitting element may include a plurality of light-emitting stacks, each including at least one light-emitting layer.

FIG. 3 exemplarily illustrates an embodiment where a light-emitting element LED includes a plurality of light-emitting stacks ST1, ST2, ST3, and ST4, unlike the light-emitting element illustrated in FIGS. 2B and 2C.

Referring to FIG. 3, a light-emitting element LED according to an embodiment may include a first electrode EL1, a second electrode EL2 facing the first electrode EL1, and the first to fourth light-emitting stacks ST1, ST2, ST3, and ST4 disposed between the first electrode EL1 and the second electrode EL2. In an embodiment, the light-emitting element LED may further include a capping layer CPL disposed on the second electrode EL2. Although FIG. 3 exemplarily illustrates an embodiment where the light-emitting element LED includes four light-emitting stacks, the number of light-emitting stacks included in the light-emitting element LED may be less than or more than four.

The light-emitting element LED may further include first to third charge generation layers CGL1, CGL2, and CGL3 disposed between the first to fourth light-emitting stacks ST1, ST2, ST3, and ST4.

In such an embodiment, when a voltage is applied to the first to third charge generation layers CGL1, CGL2, and CGL3, charges (electrons and holes) may be generated by forming a complex through an oxidation-reduction reaction. In such an embodiment, each of the first to third charge generation layers CGL1, CGL2, and CGL3 may provide the generated charges to the adjacent stacks ST1, ST2, ST3, and ST4. The first to third charge generation layers CGL1, CGL2, and CGL3 may increase or double an efficiency of the current generated in each of the adjacent stacks ST1, ST2, ST3, and ST4, and may serve to adjust the balance of the charges between the adjacent stacks ST1, ST2, ST3, and ST4.

The first to third charge generation layers CGL1, CGL2, and CGL3 may respectively include an n-type layer and a p-type layer. The first to third charge generation layers CGL1, CGL2, and CGL3 may have a structure in which an n-type layer and a p-type layer are joined to each other. However, an embodiment of the invention is not limited thereto, and the first to third charge generation layers CGL1, CGL2, and CGL3 may include only one of an n-type layer or a p-type layer. The n-type layer may be a charge generation layer that provides electrons to adjacent stacks. The n-type layer may be a layer in which a base material is doped with an n-dopant. The p-type layer may be a charge generation layer that provide holes to adjacent stacks.

In an embodiment, each of the first to third charge generation layers CGL1, CGL2, and CGL3 may have a thickness in a range of about 1 angstrom (A) to about 300 angstroms (Å). In an embodiment, for example, each of the first to third charge generation layers CGL1, CGL2, and CGL3 may have a thickness of about 165 Å. The concentration of the n-dopant doped with the first to third charge generation layers CGL1, CGL2, and CGL3 may be in a range of about 0.1% to about 3%, and specifically may be about 1%. If the concentration of the dopant is less than about 0.1%, the effect of the first to third charge generation layers CGL1, CGL2, and CGL3 for adjusting the balance of charges may be hardly achieved. If the concentration of the dopant is greater than about 3%, the light efficiency of the light-emitting element LED may be reduced.

The first to third charge generation layers CGL1, CGL2, and CGL3 may respectively include a charge generation compound including or composed of an arylamine-based organic compound, a metal, a metal oxide, a metal carbide, a metal fluoride, or a mixture thereof. In an embodiment, for example, the arylamine-based organic compound may include α-NPD, 2-TNATA, TDATA, MTDATA, sprio-TAD, or sprio-NPB. The metal may include cesium (Cs), molybdenum (Mo), vanadium (V), titanium (Ti), tungsten (W), barium (Ba), or lithium (Li). The metal oxide, metal carbide, and metal fluoride may include $Re_2O_7$, $MoO_3$, $V_2O_5$, $WO_3$, $TiO_2$, $Cs_2CO_3$, BaF, LiF, or CsF. However, materials of the first to third charge generation layers CGL1, CGL2, and CGL3 are not limited to the above examples.

Each of the first to fourth light-emitting stacks ST1, ST2, ST3, and ST4 may include a light-emitting layer. The first light-emitting stack ST1 may include a first light-emitting layer BEML-1, the second light-emitting stack ST2 may include a second light-emitting layer BEML-2, the third light-emitting stack ST3 may include a third light-emitting layer BEML-3, and the fourth light-emitting stack ST4 may include a fourth light-emitting layer GEML. Some of the light-emitting layers included in the first to fourth light-emitting stacks ST1, ST2, ST3, and ST4 may emit light of substantially a same color as each other, and some may emit light of different colors from each other.

In an embodiment, the first to third light-emitting layers BEML-1, BEML-2, and BEML-3 of the first to third light-emitting stacks ST1, ST2, and ST3 may emit substantially a same first color light. In an embodiment, for example, the first color light may be blue light, which is the above-described source light. The wavelength range of the light emitted from the first to third light-emitting layers BEML-1, BEML-2, and BEML-3 may be about 420 nm to about 480 nm.

The fourth light-emitting layer GEML of the fourth light-emitting stack ST4 may emit a second color light different from the first color light. In an embodiment, for example, the second color light may be green light. The wavelength range of the light emitted from the fourth light-emitting layer GEML may be about 520 nm to about 600 nm.

At least a portion of the first to fourth light-emitting layers BEML-1, BEML-2, BEML-3, and GEML may have a two-layer structure, layers therein including different host materials from each other. In an embodiment, for example, in the two-layer structure, one layer may include a hole-transporting host material, and the other layer may include an electron-transporting host material. The electron-transporting host material may be a material containing an electron-transporting moiety in a molecular structure.

The first light-emitting stack ST1 may further include the hole control layer HTR that transports holes provided from the first electrode EL1 to the first light-emitting layer BEML-1, and a first intermediate electron transport region METL1 that transport electrons generated from a first charge generation layer CGL1 to the first light-emitting layer BEML-1.

The hole control layer HTR may include a hole injection layer HIL disposed on the first electrode EL1, and a hole transport layer HTL disposed on the hole injection layer HIL. However, an embodiment of the invention is not limited thereto, and the hole control layer HTR may further include at least one selected from a hole buffer layer, an emission auxiliary layer, and an electron blocking layer. The hole transport layer and the hole buffer layer may be a layer that increases a light emission efficiency by compensating for a resonance distance depending on the wavelength of light emitted from the light-emitting layer. The electron blocking layer may be a layer that serves to prevent electrons from being injected from the electron transport region to the hole transport region.

The first intermediate electron transport region METL1 may include the first intermediate electron transport layer disposed on the first light-emitting layer BEML-1. However, an embodiment of the invention is not limited thereto, and the first intermediate electron transport region METL1 may further include at least one selected from an electron buffer layer and a hole blocking layer.

The second light-emitting stack ST2 may include a first intermediate hole transport region MHTR1 that transports holes generated from the first charge generation layer CGL1 to the second light-emitting layer BEML-2 and a second intermediate electron transport region METL2 that transports electrons provided from a second charge generation layer CGL2 to the second light-emitting layer BEML-2.

The first intermediate hole transport region MHTR1 may include a first intermediate hole transport layer MHTL1 disposed on the first charge generation layer CGL1. The first intermediate hole transport region MHTR1 may further include at least one selected from a hole buffer layer, an emission auxiliary layer, and an electron blocking layer, which is disposed on the first intermediate hole transport layer MHTL1. In addition, the first intermediate hole transport region MHTR1 may further include a first intermediate hole injection layer MHIL1 disposed on the first charge generation layer CGL1. The first intermediate hole injection layer MHIL1 may be disposed between the first charge generation layer CGL1 and the first intermediate hole transport layer MHTL1. However, unlike that illustrated in FIG. 3, the first intermediate hole injection layer MHIL1 may be omitted.

The second intermediate electron transport region METL2 may include a second intermediate electron transport layer disposed on the second light-emitting layer BEML-2. However, an embodiment of the invention is not limited thereto, and the second intermediate electron transport region METL2 may further include at least one selected from an electron buffer layer and a hole blocking layer, which is disposed between the second intermediate electron transport layer and the second light-emitting layer BEML-2.

The third light-emitting stack ST3 may further include a second intermediate hole transport region MHTR2 that transports holes generated from the second charge generation layer CGL2 to the third light-emitting layer BEML-3, and a third intermediate electron transport region METL3 that transports electrons provided from a third charge generation layer CGL3 to the third light-emitting layer BEML-3.

The second intermediate hole transport region MHTR2 may include a second intermediate hole transport layer MHTL2 disposed on the second charge generation layer CGL2. However, an embodiment of the invention is not limited thereto, and the second intermediate hole transport region MHTR2 may further include at least one selected from a hole buffer layer, an emission auxiliary layer, and an electron blocking layer, which is disposed on the second intermediate hole transport layer MHTL2. In addition, the second intermediate hole transport region MHTR2 may further include a second intermediate hole injection layer MHIL2 disposed on the second charge generation layer CGL2. The second intermediate hole injection layer MHIL2 may be disposed between the second charge generation layer CGL2 and the second intermediate hole transport layer MHTL2. Alternatively, the second intermediate hole injection layer MHIL2 may be omitted.

The third intermediate electron transport region METL3 may include a third intermediate electron transport layer disposed on the third light-emitting layer BEML-3. However, an embodiment of the invention is not limited thereto, and the third intermediate electron transport region METL3 may further include at least one selected from an electron buffer layer and a hole blocking layer, which is disposed between the third intermediate electron transport layer and the third light-emitting layer BEML-3.

The fourth light-emitting stack ST4 may further include a third intermediate hole transport region MHTR3 that transports holes generated from the third charge generation layer CGL3 to the fourth light-emitting layer GEML, and the electron control layer ETR that transports electrons provided from the second electrode EL2 to the fourth light-emitting layer GEML.

The third intermediate hole transport region MHTR3 may include a third intermediate hole transport layer MHTL3 disposed on the third charge generation layer CGL3. However, an embodiment of the invention is not limited thereto, and the third intermediate hole transport region MHTR3 may further include at least one selected from a hole buffer layer, an emission auxiliary layer, and an electron blocking layer, which is disposed on the third intermediate hole transport layer MHTL3. In addition, the third intermediate hole transport region MHTR3 may further include a third intermediate hole injection layer MHIL3 disposed on the third charge generation layer CGL3. The third intermediate hole injection layer MHIL3 may be disposed between the third charge generation layer CGL3 and the third intermediate hole transport layer MHTL3. Alternatively, the third intermediate hole injection layer MHIL3 may be omitted.

The electron control layer ETR may include an electron transport layer ETL disposed on the fourth light-emitting layer GEML and an electron injection layer EIL disposed on the electron transport layer ETL. However, an embodiment of the invention is not limited thereto, and the electron control layer ETR may further include at least one selected from an electron buffer layer and a hole blocking layer, which is disposed between the electron transport layer ETL and the fourth light-emitting layer GEML.

In an embodiment, the light-emitting element LED may emit light in a direction from the first electrode EL1 to the second electrode EL2, and based on the direction in which the light is emitted, the hole control layer HTR may be disposed below the plurality of light-emitting stacks ST1, ST2, ST3, and ST4, and the electronic control layer ETR may be disposed above the plurality of light-emitting stacks ST1, ST2, ST3, and ST4. However, an embodiment of the invention is not limited thereto, and based on the light-emitting direction, the light-emitting element may have an inverted element structure in which the electron control layer ETR is disposed below the plurality of stacks ST1, ST2, ST3, and ST4 and the hole control layer HTR is disposed above the plurality of stack ST1, ST2, ST3, and ST4.

Referring back to FIG. 2C, the electronic control layer ETR may be disposed between the light-emitting layer EML and the second electrode EL2. The electron control layer ETR may include at least one selected from an electron injection layer, an electron transport layer, and a hole blocking layer. Referring to FIG. 2C, the electron control layer ETR may be disposed as a common layer to overlap the light-emitting regions EA1, EA2, and EA3 and the entirety of the pixel defining film PDL that separates the light-emitting regions EA1, EA2, and EA3. However, an embodiment of the invention is not limited thereto, and the electron control layer ETR may be provided through patterning so that the electron control layer ETR is separately disposed corresponding to each of the light-emitting regions EA1, EA2, and EA3.

The second electrode EL2 is provided on the electronic control layer ETR. The second electrode EL2 may be a common electrode. The second electrode EL2 may be a cathode or an anode, but an embodiment of the invention is not limited thereto. In an embodiment, for example, the first electrode EL1 is an anode, and the second electrode EL2 may be a cathode. Alternatively, the first electrode EL1 is a cathode, and the second electrode EL2 may be an anode. The second electrode EL2 may be a transmissive electrode, a transflective electrode, or a reflective electrode.

The encapsulation layer TFE may be disposed on the display element LED. In an embodiment, for example, the encapsulation layer TFE may be disposed on the second electrode EL2. In an embodiment, where the light-emitting element LED includes a capping layer CPL (shown in FIG. 3), the encapsulation layer TFE may be disposed on the capping layer CPL. In an embodiment, as described above, the encapsulation layer TFE may include at least one organic film and at least one inorganic film, and the inorganic film and the organic film may be alternately disposed one on another.

The display panel DP according to an embodiment may include an optical structure layer OSL disposed on the display element layer DP-LED. The optical structure layer OSL may include the light control layer CCL, the color filter layer CFL, and the base layer BL.

The light control layer CCL may include a light converter. The light converter may be quantum dots or phosphors. The light converter may wavelength-convert the provided light and emit the wavelength-converted light. In an embodiment, the light control layer CCL may be a layer including the quantum dots or a layer including the phosphors at least in part.

The light control layer CCL may include a plurality of light control patterns CCP-R, CCP-B, and CCP-G. The light control patterns CCP-R, CCP-B, and CCP-G may be spaced apart from each other. The light control patterns CCP-R, CCP-B, and CCP-G may be disposed to be spaced apart from each other by the bank BMP. The light control patterns CCP-R, CCP-B, and CCP-G may be disposed in the bank opening BW-OH defined in the bank BMP. However, an embodiment of the invention is not limited thereto. FIG. 2C illustrates an embodiment where the bank BMP has a rectangular shape in cross-section and does not overlap the light control patterns CCP-R, CCP-B, and CCP-G. Alternatively, at least a portion of the edges of the light control patterns CCP-R, CCP-B, and CCP-G may overlap the bank BMP. The bank BMP may have a trapezoidal shape in cross-section. As the bank BMP is more adjacent to the display element layer DP-LED, the cross-sectional width may become greater.

The light control patterns CCP-R, CCP-B, and CCP-G may be portions that convert the wavelength of light provided from the display element layer DP-LED or transmit the provided light. In an embodiment, the light control patterns CCP-R, CCP-B, and CCP-G may be formed by an inkjet process. In such an embodiment, a liquid ink composition may be provided in the bank openings BW-OH, and the provided ink composition may be polymerized by a thermal curing process or a photo-curing process to form the light control patterns CCP-R, CCP-B, and CCP-G.

The light control layer CCL may include a first light control pattern CCP-R including first quantum dots that converts the source light provided from the light-emitting element LED into the first light, a second light control pattern CCP-B that transmits the source light, and a third light control pattern CCP-G including second quantum dots that converts the source light into the second light.

In an embodiment, the first light control pattern CCP-R may provide red light, which is the first light, and the second light control pattern CCP-B may be provided by transmitting blue light among the source light provided by the light-emitting element LED. The third light control pattern CCP-G may provide green light, which is the second light. In an embodiment, for example, the first quantum dots may be red quantum dots, and the second quantum dots may be green quantum dots.

In an embodiment, the light control layer CCL may further include the scatterers. The first light control pattern CCP-R includes the first quantum dots and the scatterers, the third light control pattern CCP-G includes the second quantum dots and the scatterers, and the second light control pattern CCP-B may not include the quantum dots and include the scatterers.

Each of the first light control pattern CCP-R, the second light control pattern CCP-B, and the third light control pattern CCP-G may include a base resin in which the quantum dots and the scatterers are dispersed. In an embodiment, the first light control pattern CCP-R may include the first quantum dots and the scatterers dispersed in a base resin, the third light control pattern CCP-G may include the second quantum dots and the scatterers dispersed in the base resin, and the second light control pattern CCP-B may include the scatterers dispersed in the base resin.

The light control layer CCL may further include barrier layers CAP and CAP-T disposed on an upper portion or a lower portion of a light control part. The barrier layer may include the a first barrier layer CAP adjacent to the display element layer DP-LED and the second barrier layer CAP-T spaced apart from the display element layer DP-LED with the light control pattern CCP-R therebetween.

In an embodiment of the display panel DP, the optical structure layer OSL includes the color filter layer CFL disposed on the light control layer CCL. The color filter layer CFL may include color filters CF1, CF2, and CF3. The color filter layer CFL may include a first color filter CF1 that transmits the first light, a second color filter CF2 that transmits part of the source light, and a third color filter CF3 that transmits the second light. In an embodiment, the first color filter CF1 may be a red filter, the second color filter CF2 may be a blue filter, and the third color filter CF3 may be a green filter.

Each of the filters CF1, CF2, and CF3 includes a polymer photosensitive resin and a colorant. The first color filter CF1 may include a red colorant, the second color filter CF2 may include a blue colorant, and the third color filter CF3 may include a green colorant. The first color filter CF1 may include a red pigment or a red dye, the second color filter CF2 may include a blue pigment or a blue dye, and the third color filter CF3 may include a green pigment or a green dye.

The first to third color filters CF1, CF2, and CF3 may respectively correspond to the first pixel region PXA-R, the second pixel region PXA-B, and the third pixel region PXA-G. In addition, the first to third color filters CF1, CF2, and CF3 may respectively correspond to the first light control pattern to third light control pattern CCP-R, CCP-B, and CCP-G.

In an embodiment, portions of the plurality of color filters CF1, CF2, and CF3, which transmit different light, corresponding to the peripheral region NPXA disposed between the pixel regions PXA-R, PXA-B, and PXA-G may be disposed to overlap each other. The plurality of color filters CF1, CF2, and CF3 may overlap each other in the third direction DR3, which is the thickness direction, to separate a boundary between the adjacent light-emitting regions PXA-R, PXA-B, and PXA-G. Alternatively, the color filter layer CFL may include a light blocking part (not shown) for dividing a boundary between the adjacent color filters CF1, CF2, and CF3. The light blocking part (not shown) may include or be formed of a blue filter or may include an organic light blocking material or an inorganic light blocking material that includes a black pigment or a black dye.

The color filter layer CFL may include the low refractive index layer LR. The low refractive index layer LR may be disposed between the light control layer CCL and the color filters CF1, CF2, and CF3. The low refractive index layer LR may be disposed on the upper portion of the light control layer CCL to block the light control pattern CCP-R, CCP-B, and CCP-G from being exposed to moisture/oxygen. In addition, the low refractive index layer LR may serve as an optical functional layer that is disposed between the light control pattern CCP-R, CCP-B, and CCP-G and the color filters CF1, CF2, and CF1 to increase light extraction efficiency or prevent reflected light from being incident on the light control layer CCL. The low refractive index layer LR may have a smaller refractive index than a layer adjacent thereto.

The low refractive index layer LR may include a polymer resin, and inorganic particles dispersed in the polymer resin. The polymer resin included in the low refractive index layer LR may be, for example, a silicone resin and/or an acrylic silicone resin. The inorganic particles included in the low refractive index layer LR may be, for example, hollow sphere silica and/or porogen. The low refractive index layer LR may be formed of or defined by a single layer or a plurality of layers.

In an embodiment of the display device DD, the color filters CF1, CF2, and CF3 of the color filter layer CFL may be directly disposed on the light control layer CCL. In such an embodiment, the low refractive index layer LR may be omitted.

In an embodiment, the optical structure layer OSL may further include a base layer BL disposed on the color filter layer CFL. The base layer BL may be a member that provides a base surface on which the color filter layer CFL, the light control layer CCL, and the like are disposed. The base layer BL may be a glass substrate, a metal substrate, a plastic substrate, or the like. However, an embodiment of the invention is not limited thereto, and the base layer BL may be an inorganic layer, an organic layer, or a composite material layer. Alternatively, the base layer BL may be omitted.

Referring to FIGS. 2B and 2C again, the transmittance of each of the first color filter CF1 and the second color filter CF2 may be limited to a certain range according to a colorant, composition, and thickness, etc.

The first color filter CF1 included in the color filter layer CFL according to an embodiment may have a light transmittance of about 70% or less in a wavelength range of about 600 nm to about 640 nm. The first color filter CF1 may have a light transmittance of about 60% to about 70% at the peak wavelength ($\lambda_{Tmax}$ in FIGS. 4A and 4B) of the first light that is emitted from the first light control pattern CCP-R disposed below the first color filter CF1. In an embodiment, the first light has a peak wavelength in all of a wavelength range of about 620 nm to about 640 nm. The first color filter CF1 may have a light transmittance of about 60% to about 70% in a range of about 620 nm to about 640 nm, which is the peak wavelength range of the first light, and a range of about 600 nm or more and less than about 620 nm, which is adjacent to the peak wavelength range.

The first color filter CF1 may include a point at which the light transmittance is about 10% in a wavelength range of greater than about 590 nm and less than or equal to about 610 nm. That is, the point at which the first color filter CF1 has a light transmittance of about 10% in the light transmittance spectrum may be located in a wavelength range greater than about 590 nm and less than or equal to about 610 nm, which is a range adjacent to the peak wavelength range of the first light. Since the point at which the first color filter CF1 has a light transmittance of about 10% is located in a wavelength range greater than about 590 nm and less than or equal to about 610 nm, the light transmittance spectrum of the first color filter CF1 may have a narrow shape in which a light absorbing rate increases sharply as approaching a desired specific wavelength and significantly decreases as the wavelength deviates therefrom.

The first color filter CF1 may have a transmittance of less than about 10% in a wavelength range of about 590 nm or less. That is, the first color filter CF1 may have a low light transmittance of less than 10% in a wavelength range of about 590 nm or less that deviates from the peak wavelength range of the first light. Accordingly, the first color filter CF1 may block light having a wavelength other than the first light, thereby improving the color reproducibility of the display panel DP.

The second color filter CF2 included in the color filter layer CFL according to an embodiment may have a light transmittance of about 75% or less in a wavelength range of about 430 nm to about 470 nm. The second color filter CF2 may have a light transmittance of about 65% to about 75% at the peak wavelength ($\lambda_{Tmax}$) of the source light that is emitted from the second light control pattern CCP-B disposed therebelow. In an embodiment, the source light has a peak wavelength in the wavelength range of about 440 nm to about 460 nm. The second color filter CF2 may have a light transmittance of about 65% to about 75% in all of a wavelength range of about 440 nm to about 460 nm, which is the peak wavelength range of the source light, a range of about 430 nm to less than about 440 nm, and a range of about 460 nm or more and less than about 470 nm, which is adjacent to the peak wavelength range.

The second color filter CF2 may have a FWHM of a light transmittance spectrum of about 95 nm or less. The second color filter CF2 has a light transmittance spectrum having a FWHM of 95 nm or less. The light transmittance spectrum of the second color filter CF2 may have a narrow shape in which a light absorbing rate increases sharply as approaching a desired specific wavelength and significantly decreases as the wavelength deviates therefrom.

The first color filter CF1 includes the red colorant. The first color filter CF1 may include a red pigment or a red dye. In an embodiment, the first color filter CF1 may include at least one red pigment selected from C.I. Pigment Red (red pigment) 1, 2, 3, 4, 5, 7, 9, 12, 14, 23, 38, 41, 42, 48, 48:1, 48:2, 48:3, 48:4, 48:5, 48:6, 49, 49:1, 51:1, 52:1, 52:2, 53, 53:1, 53:3, 57, 57:1, 57:2, 57:3, 58:2, 58:4, 63:1, 81, 81:1, 81:2, 81:3, 81:4, 81:5, 81:6, 88, 112, 122, 123, 144, 146, 148, 149, 150, 166, 168, 169, 170, 175, 176, 177, 178, 179, 184, 185, 187, 188, 190, 192, 194, 200, 200:1, 202, 206, 207, 208, 209, 210, 214, 216, 220, 221, 224, 242, 246, 247, 251, 253, 254, 255, 256, 257, 260, 262, 264, 270, 272, and 291. In an embodiment, for example, the first color filter CF1 may include C.I. Pigment Red 179 or C.I. Pigment Red 264. In addition, first color filter CF1 may further include perylene-based, perinone-based, quinacridone-based, quinacridone-quinone-based, anthraquinone-based, antanthrone-based, and benzimidazolone-based, disazo-based, azo-based, indanthrone-based, phthalocyanine-based, triarylcarbonium-based, dioxazine-based, aminoanthraquinone-based, thioindigo-based, isoindoline-based, isoindolinone-based, pyranthrone-based or isoviolanthron-based red pigments or mixtures thereof, etc.

The first color filter CF1 may further include a black colorant in addition to the red colorant. In an embodiment, the first color filter CF1 may include at least one black pigment selected from carbon black, aniline black, lactam black, and perylene black. In an embodiment, the first color filter CF1 may include carbon black or lactam black as the black colorant.

In the first color filter CF1, the amount of the black colorant relative to the total weight of the red colorant and the black colorant may include about 1 weight percent (wt %) or less. The first color filter CF1 may include only the red colorant as a colorant, or may include about 1% or less of the black colorant and the remainder of the red colorant. Based on the total weight % of the first color filter CF1, the total colorant may be included in an amount of about 6% to about 11%. The content ratio of the colorant included in the first color filter CF1 may vary depending on the thickness of the first color filter CF1.

The second color filter CF2 includes the blue colorant. The second color filter CF2 may include a blue pigment or a blue dye. In an embodiment, the second color filter CF2 may include, for example, a copper phthalocyanine-based pigment. The second color filter CF2 may include at least one blue pigment selected from CI Pigment B15, CI Pigment B15:1, CI Pigment B15:2, CI Pigment B15:3, CI Pigment B15:4, CI Pigment B15:6, CI Pigment B16, CI Pigment B22, CI Pigment B60 and CI Pigment B64. In an embodiment, the second color filter CF2 may include CI Pigment B15:6. Alternatively, the second color filter CF2 may include a blue dye.

The second color filter CF2 may further include a purple colorant in addition to the blue colorant. In an embodiment, the second color filter CF2 may include at least one purple pigment selected from C.I. Pigment V1, C.I. Pigment V19, C.I. Pigment V23, C.I. Pigment V27, C.I. Pigment V29, C.I. Pigment V30, C.I. Pigment V32, C.I. Pigment V37, C.I. Pigment V40, C.I. Pigment V42 and C.I. Pigment V50. In an embodiment, the second color filter CF2 may include CI Pigment V23. Alternatively, the second color filter CF2 may include a purple dye.

In the second color filter CF2, the weight ratio of the blue colorant and the purple colorant may be in a range of about 70:30 to about 80:20. The second color filter CF2 may include about 70% to about 80% of the blue colorant or about 20% to about 30% of the purple colorant. Based on the total weight % of the second color filter CF2, the total colorant may be included in an amount of about 3% to about 7%. The content ratio of the colorant included in the second color filter CF2 may vary according to the thickness of the second color filter CF2.

The thickness of the first color filter CF1 may be greater than the thickness of the second color filter CF2. In an embodiment, as shown in FIG. 2B, the first color filter CF1 may have a first thickness d1, the second color filter CF2 may have a second thickness d2, and the first thickness d1 may be greater than the second thickness d2. In an embodiment, the first thickness d1 may be in a range of about 3 micrometers (μm) to about 5.5 μm. The second thickness d2 may in a range of be about 1.8 μm to about 4.2 μm. Meanwhile, as illustrated in FIG. 2C, the third color filter CF3 may have a thickness less than that of the first color filter CF1 and greater than that of the second color filter CF2. In an embodiment, the thickness of the third color filter CF3 may be in a range of about 2.4 μm to about 4.8 μm.

In the color filter layer CFL according to an embodiment, transmittance at a peak wavelength, transmittance in adjacent to the peak wavelength range, and FWHM of light provided from each of light control patterns CCP-R and CCP-B, which are respectively disposed below the first color filter CF1 and the second color filter CF2, may be adjusted to be in a predetermined range or less to realize high color reproducibility.

In the color filter layer CFL according to an embodiment, the first color filter and the second color filter respectively adjusts transmittance at a peak wavelength of light provided from the lower portion of the color filter layer to be about 70% or less and be about 75% or less, and forms a narrow width for each wavelength of the light transmittance spectrum. The display panel DP according to an embodiment of the invention has a structure in which a polarizing layer is omitted, and the transmittance at the peak wavelength of light provided from the light source is respectively adjusted to be about 70% or less and about 75% or less, and the width of each wavelength of the light transmittance spectrum is narrowed to control the reflectance and transmittance of light in a trade-off relationship with each other without the polarizing layer. Accordingly, light reflected by external light may be reduced while light of a specific wavelength range among the light provided from therebelow is selectively transmitted. Accordingly, the display panel DP including the color filter layer CFL according to an embodiment may have low reflectance and high color reproducibility.

Figure 4A:
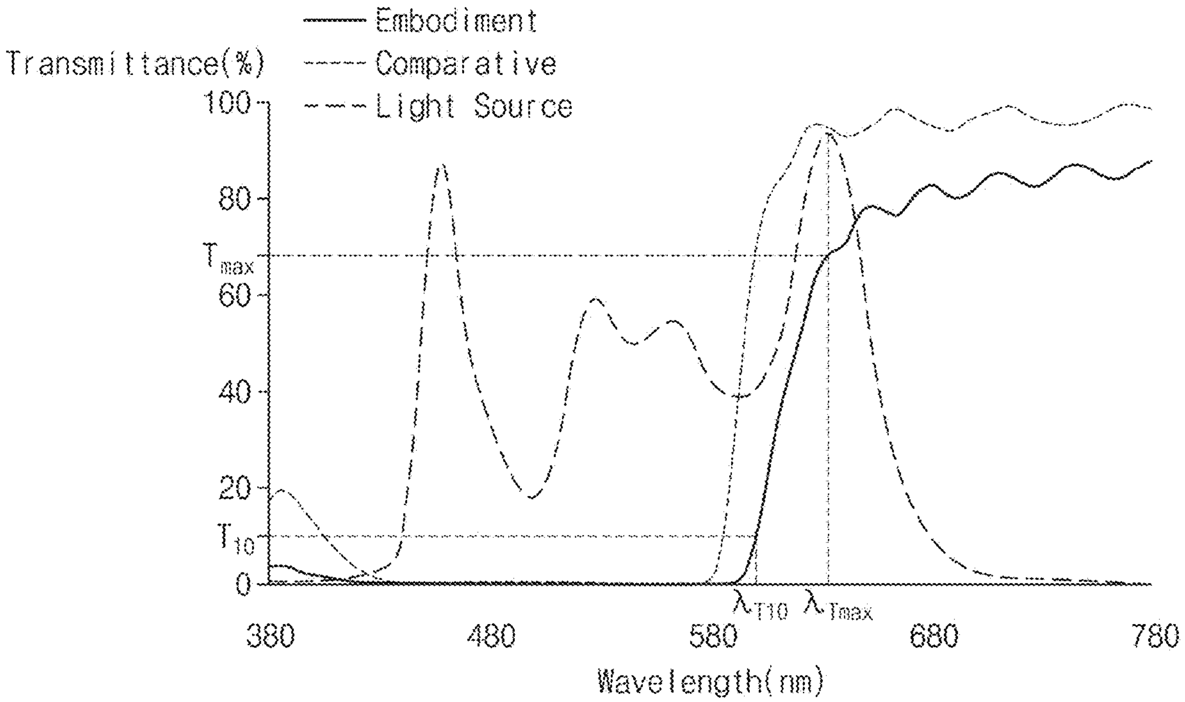
FIG. 4A shows a light transmittance graph of a first color filter included in a display panel according to an embodiment of the invention, a light transmittance graph of a color filter according to Comparative Example, and a graph for the transmittance of light emitted from a light source according to an embodiment of the invention.
Figure 4B:
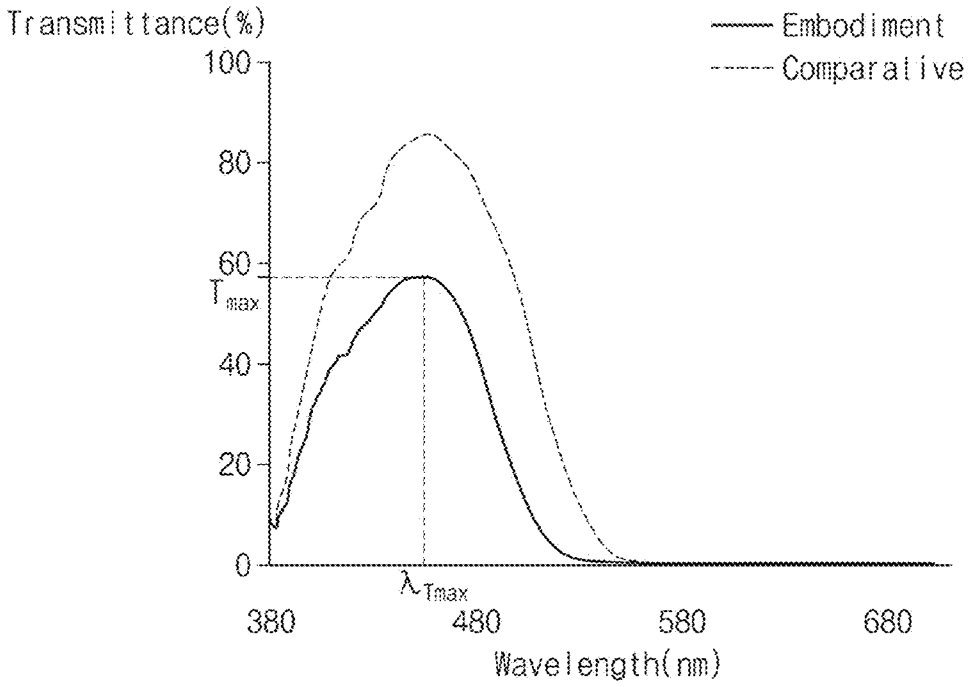
FIG. 4B shows a light transmittance graph of a second color filter included in a display panel according to an embodiment of the invention and a light transmittance graph of a color filter according to Comparative Example.

FIG. 4A shows a light transmittance graph of a first color filter included in a display panel according to an embodiment of the invention, a light transmittance graph of a color filter according to Comparative Example, and a graph for the transmittance of light emitted from a light source according to an embodiment of the invention. FIG. 4B shows a light transmittance graph of a second color filter included in a display panel according to an embodiment of the invention and a light transmittance graph of color filter according to Comparative Example. In FIG. 4A, a "light source" graph shows an emission spectrum of the first light after the source light provided from the light emitting-element LED illustrated in FIG. 2C passes through the first light control pattern CCP-R.

By using an LCF-2100QD spectrometer manufactured by Otsuka Corporation, the transmittance of each of the first color filter and the second color filter was measured by: forming each of the first color filter and the second color filter on a glass substrate; then disposing the resultant glass substrate on a stage; and acquiring a spectral value of light that has been provided from below the glass substrate and transmitted through each of the first color filter and the second color filter.

By using a CM-2600D spectrometer manufactured by Konica Minolta Corporation, the reflectance of each of the first color filter and the second color filter was calculated by: forming each of the first color filter and the second color filter on a glass substrate; then disposing the resultant glass substrate on a stage; irradiating the upper surfaces of the first color filter and the second color filter with light at an oblique angle; and then measuring the light that has been impinged on and reflected by a sample, has then be bounced and scattered in a integrating sphere, and has become uniform.

Referring to a graph shown in FIG. 4A, as described above, the first light has a maximum peak wavelength $\lambda_{Tmax}$ in a wavelength range of about 620 nm to about 640 nm, more specifically, about 630 nm. As described above, it may be seen that the first color filter of Embodiment has a light transmittance $T_{max}$ of about 70% or less at a point of about 630 nm, which is the peak wavelength $\lambda_{Tmax}$ of the first light. On the other hand, it may be seen that the color filter of Comparative Example has a high transmittance of about 90% or more at the peak wavelength $\lambda_{Tmax}$ of the first light. In addition, it may be seen that the point $T_{10}$ at which the first color filter of Embodiment has a light transmittance of about 10% in the light transmittance spectrum is located in a wavelength range greater than about 590 nm and less than or equal to about 610 nm $\lambda_{T10}$. On the other hand, it may be seen that the color filter of Comparative Example has a high transmittance of about 70% or more at the $\lambda_{T10}$ point, and the point at which the color filter of Comparative Example has a light transmittance of about 10% in the light transmittance spectrum is located in a wavelength range about 580 nm.

Referring to a graph shown in FIG. 4B, the second light provided to the second color filter of Embodiment and the color filter of Comparative Example has a maximum peak wavelength $\lambda_{Tmax}$ in a wavelength range of about 430 nm to about 470 nm, more specifically, about 450 nm. Meanwhile, as described above, it may be seen that the second color filter of Embodiment has a low light transmittance $T_{max}$ of about 75% or less at a point of about 450 nm, which is the peak wavelength $\lambda_{Tmax}$ of the second light. On the other hand, it may be seen that the color filter of Comparative Example has a high transmittance of 80% or more at the peak wavelength $\lambda_{Tmax}$ of the second light.

Table 1 below shows the light transmittance, reflectance, and color matching rate of the display panel including the color filter layer of Examples and Comparative Examples. In Table 1, the color filter layer of Example is a color filter layer including the first color filter and the second color filter, according to an embodiment of the invention as described above in the description of FIGS. 2B and 2C. That is, the first color filter included in the color filter layer of Example has a light transmittance of about 64.32% at a point of about 630 nm, and the point at which the light transmittance is 10% in the light transmittance spectrum is located at 599 nm. The second color filter included in the color filter layer of Example has a light transmittance of about 71.76% at a point of 440 nm, and a wavelength at FWHM of the light transmittance spectrum is 90 nm.

In the color filter layer of Comparative Example, unlike the color filter layer of Example, the red color filter corresponding to the first color filter has a light transmittance of about 95.66% at a point of about 630 nm, and a point at which the first color filter has a light transmittance of about 10% in the light transmittance spectrum is located at about 587 nm. In the color filter layer of Comparative Example, the blue color filter corresponding to the second color filter has a light transmittance of about 85.58% at a point of about 440 nm, and a wavelength at FWHM of the light transmittance spectrum is 108 nm.

In Table 1, the color matching rate was evaluated based on the BT2020 color range and the DCI color range.

TABLE 1

| | Thickness (um) | | | color matching rate (%) | |
|---|---|---|---|---|---|
| | First color filter | Second color filter | reflectance (%) | BT2020 | DCI |
| Example | 4.2 | 3.0 | 5.07 | 91.3 | 99.7 |
| Comparative Example | 2.4 | 2.6 | 10.3 | 84.1 | — |

Referring to the results of Table 1, it may be seen that the display panel including the color filter layer of Example has the significantly reduced reflectance of an upper portion of the panel, and the color matching rate was also improved compared to the display panel including the color filter layer of Comparative Example. Referring to the results in Table 1, in the color filter layer according to an embodiment, transmittance at a peak wavelength, transmittance in adjacent to the peak wavelength range, and FWHM of light provided from light source may be adjusted to be in a predetermined range or less. Accordingly, it may be seen that light reflected by external light may be reduced while light of a specific wavelength range among the light provided from therebelow is selectively transmitted to realize low reflectance and high color reproducibility when the color filter layer is applied to a display panel.

According to the optical member according to an embodiment of the invention and a display panel including the same, transmittance of a color filter at a peak wavelength, transmittance in adjacent to the peak wavelength range, and FWHM of light provided from light source may be adjusted to a predetermined range or less to optimize a transmission efficiency while lowering the reflectance and improving the color reproducibility, and thus a display panel having excellent color tone may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:

a light-emitting element which outputs source light and includes a first electrode, a light-emitting layer disposed on the first electrode, and a second electrode disposed on the light-emitting layer;

a light control layer disposed on the light-emitting element and including a first light control pattern which converts the source light into first light, and a second light control pattern which transmits the source light; and a color filter layer disposed on the light control layer and including a first color filter overlapping the first light control pattern, and a second color filter overlapping the second light control pattern, wherein the first color filter is a red color filter and has a light transmittance maintained within a range of about 60% to about 70% at each wavelength throughout a wavelength range of about 600 nm to about 640 nm, and the second color filter is a blue color filter and has a light transmittance maintained within a range of about 65% to about 75% at each wavelength throughout a wavelength range of about 430 nm to about 470 nm.

2. The display panel of claim 1, wherein the first color filter includes a point at which the light transmittance is about 10% in a wavelength range of about 590 nm to about 610 nm.

3. The display panel of claim 2, wherein the first color filter has a transmittance of less than about 10% in a wavelength range of about 590 nm or less.

4. The display panel of claim 2, wherein the transmittances of the first color filter and the second color filter are measured through a spectrometer.

5. The display panel of claim 1, wherein the second color filter has a full width of half maximum of a light transmittance spectrum of about 95 nm or less.

6. The display panel of claim 5, wherein a wavelength of the first light is longer than a wavelength of the source light, and the first light control pattern includes first quantum dots which converts the source light into the first light.

7. The display panel of claim 1, wherein the first color filter includes a red colorant, and the second color filter includes a blue colorant.

8. The display panel of claim 7, wherein the first color filter further includes a black colorant, and the black colorant is included in an amount of about 1 wt % or less with respect to a total weight of the red colorant and the black colorant.

9. The display panel of claim 7, wherein the second color filter further includes a purple colorant, and a weight ratio of the blue colorant to the purple colorant is in a range of about 70:30 to about 80:20.

10. The display panel of claim 1, wherein the first color filter has a thickness in a range of about 3 μm to about 5.5 μm, and the second color filter has a thickness in a range of about 1.8 μm to about 4.2 μm.

11. The display panel of claim 1, further comprising:

a base substrate disposed below the light-emitting element; and a base layer disposed on the color filter layer.

12. The display panel of claim 11, further comprising:

an anti-reflection layer disposed on the base layer.

13. The display panel of claim 12, wherein the light-emitting element receives unpolarized incident light from above the anti-reflection layer.

14. The display panel of claim 1, wherein the color filter layer further comprises a low refractive index layer disposed between the light control layer and the first and second color filters, and a refractive index of the low refractive layer is about 1.3 or less.

15. The display panel of claim 1, wherein the light-emitting element is disposed between the first electrode and the second electrode, and the light-emitting element includes a plurality of light-emitting stacks, each including the light-emitting layer.

16. The display panel of claim 15, wherein the plurality of light-emitting stacks include:

a first light-emitting stack disposed on the first electrode and including a first light-emitting layer;

a charge generation layer disposed on the first light-emitting stack; and a second light-emitting stack disposed on the charge generation layer and including a second light-emitting layer, and the first light-emitting layer emits light of a color different from light emitted from the second light-emitting layer.

17. A display panel comprising:

a lower panel including a display element layer and an encapsulation layer disposed on the display element layer;

an upper panel disposed on the lower panel; and a filling layer disposed between the lower panel and the upper panel, wherein the upper panel includes:

a light control layer disposed on the filling layer and including a first light control pattern which converts source light into first light and a second light control pattern which transmits the source light, and a color filter layer disposed on the light control layer and including a first color filter overlapping the first light control pattern, and a second color filter overlapping the second light control pattern, and wherein the first color filter has a thickness in a range of about 3 μm to about 5.5 μm, the second color filter has a thickness in a range of about 1.8 μm to about 4.2 μm, the first color filter is a red color filter and has a light transmittance maintained within a range of about 60% to about 70% at each wavelength throughout a wavelength range of about 600 nm to about 640 nm, the second color filter is a blue color filter and has a light transmittance maintained within a range of about 65% to about 75% at each wavelength throughout a wavelength range of about 430 nm to about 470 nm, and the thickness of the first color filter is greater than the thickness of the second color filter.

18. The display panel of claim 17, further comprising:

an anti-reflection layer disposed on the color filter layer, and wherein the display element layer receives unpolarized incident light from above the anti-reflection layer.

* * * * *